US010040226B2

(12) United States Patent
Benson

(10) Patent No.: US 10,040,226 B2
(45) Date of Patent: Aug. 7, 2018

(54) METHODS AND MATERIALS FOR MAKING A MONOLITHIC POROUS PAD CAST ONTO A ROTATABLE BASE

(71) Applicant: ENTEGRIS, INC., Billerica, MA (US)

(72) Inventor: Briant Enoch Benson, El Dorado, CA (US)

(73) Assignee: Entegris, Inc., Billerica, MA (US)

( * ) Notice: Subject to any disclaimer, the term of this patent is extended or adjusted under 35 U.S.C. 154(b) by 575 days.

(21) Appl. No.: 14/584,548

(22) Filed: Dec. 29, 2014

(65) Prior Publication Data

US 2015/0183141 A1    Jul. 2, 2015

Related U.S. Application Data

(63) Continuation of application No. 14/029,471, filed on Sep. 17, 2013, now Pat. No. 8,920,571, which is a
(Continued)

(51) Int. Cl.
*B29C 44/12* (2006.01)
*A46B 13/00* (2006.01)
(Continued)

(52) U.S. Cl.
CPC ............ *B29C 44/12* (2013.01); *A46B 13/008* (2013.01); *A46B 13/02* (2013.01); *B08B 1/04* (2013.01);
(Continued)

(58) Field of Classification Search
CPC . B29C 44/12; B29C 44/1209; B29C 44/1214; B29C 37/0078; B29C 44/005;
(Continued)

(56) References Cited

U.S. PATENT DOCUMENTS 2,609,347 A    9/1952  Lumley
2,753,577 A    7/1956  Van Clief, Jr.
(Continued)

FOREIGN PATENT DOCUMENTS

EP    0 530 536 A1    3/1993
FR    1 109 177 A    1/1956
(Continued)

*Primary Examiner* — Jeffrey Wollschlager
(74) *Attorney, Agent, or Firm* — Entegris, Inc.

(57) ABSTRACT

The present invention includes methods and materials for cleaning materials, particles, or chemicals from a substrate with a brush or pad. The method comprising: engaging a surface of a rotating wafer with an outer circumferential surface of a rotating cylindrical foam roller, the cylindrical foam roller having a plurality of circumferentially and outwardly extending spaced apart nodules extending from the outer surface, each nodule defining a height extending from the outer surface of the cylindrical foam roller to a substrate engagement surface of the nodule, the substrate engagement surface of one or more of the nodules having a rounded configuration; and positioning the cylindrical foam roller on the substrate such that the one or more nodules are positioned to have only the rounded substrate engagement surface contact the substrate such that no linear surface of the one or more nodules contacts the substrate.

16 Claims, 30 Drawing Sheets

Related U.S. Application Data continuation of application No. 13/190,191, filed on Jul. 25, 2011, now Pat. No. 8,533,895, which is a continuation of application No. 10/566,847, filed as application No. PCT/US2004/022350 on Jul. 13, 2004, now Pat. No. 7,984,526.

(60) Provisional application No. 60/557,298, filed on Mar. 29, 2004, provisional application No. 60/493,992, filed on Aug. 8, 2003, provisional application No. 60/493,993, filed on Aug. 8, 2003, provisional application No. 60/493,755, filed on Aug. 8, 2003.

(51) Int. Cl.
| | | |
|---|---|---|
| *A46B 13/02* | (2006.01) | |
| *B08B 1/04* | (2006.01) | |
| *B24D 3/32* | (2006.01) | |
| *B24D 5/10* | (2006.01) | |
| *H01L 21/02* | (2006.01) | |
| *B29C 37/00* | (2006.01) | |
| *B29C 44/00* | (2006.01) | |
| *B29K 29/00* | (2006.01) | |

(52) U.S. Cl.
CPC ............... *B24D 3/32* (2013.01); *B24D 5/10* (2013.01); *H01L 21/02074* (2013.01); *A46B 2200/3086* (2013.01); *B29C 37/0078* (2013.01); *B29C 44/005* (2013.01); *B29C 44/1209* (2013.01); *B29C 44/1214* (2013.01); *B29K 2029/04* (2013.01); *Y10S 134/902* (2013.01); *Y10S 438/906* (2013.01)

(58) Field of Classification Search
CPC . B29C 44/02; H01L 21/02074; A46B 13/008; A46B 13/02; A46B 2200/3086; B08B 1/04; B24D 3/32; B24D 5/10; B29K 2029/04; Y10S 438/906; Y10S 134/902
See application file for complete search history.

(56) References Cited

U.S. PATENT DOCUMENTS

| | | | |
|---|---|---|---|
| 2,965,911 A | 12/1960 | Hempel et al. | |
| 3,663,470 A | 5/1972 | Nishimura | |
| 4,083,906 A | 4/1978 | Schindler et al. | |
| 4,566,911 A | 1/1986 | Tomita et al. | |
| 5,144,711 A | 9/1992 | Gill, Jr. | |
| 5,247,765 A | 9/1993 | Quintana | |
| 5,311,634 A * | 5/1994 | Andros | H01L 21/67046 15/102 |
| 5,419,003 A | 5/1995 | Tollasepp | |
| 5,554,659 A | 9/1996 | Rosenblatt | |
| 5,778,481 A | 7/1998 | Amsden et al. | |
| 5,806,126 A | 9/1998 | de Larios et al. | |
| 5,870,793 A | 2/1999 | Choffat et al. | |
| 5,875,507 A | 3/1999 | Stephens et al. | |
| 6,006,391 A | 12/1999 | Shurtliff et al. | |
| 6,247,197 B1 * | 6/2001 | Vail | B08B 1/04 118/259 |
| 6,299,698 B1 | 10/2001 | Emami et al. | |
| 6,308,623 B1 | 10/2001 | Schonberger et al. | |
| 6,467,120 B1 | 10/2002 | Ziemins et al. | |
| 6,502,271 B1 | 1/2003 | Epshteyn | |
| 6,502,273 B1 | 1/2003 | Mihara et al. | |
| 6,543,084 B2 | 4/2003 | Dickey et al. | |
| 6,557,202 B1 * | 5/2003 | Bliven | H01L 21/67046 15/102 |
| 6,598,255 B1 | 7/2003 | Gohda et al. | |
| 6,655,746 B1 | 12/2003 | Weihrauch | |
| 6,665,746 B1 | 12/2003 | Liong | |
| 6,682,402 B1 * | 1/2004 | Roberts | B24B 37/26 216/52 |
| 6,684,447 B2 | 2/2004 | Mihara et al. | |
| 6,953,388 B2 | 10/2005 | Shimagaki et al. | |
| 7,229,579 B1 | 6/2007 | Martin et al. | |
| 7,955,693 B2 | 6/2011 | Drury | |
| 8,092,730 B2 | 1/2012 | Wargo et al. | |
| D682,497 S | 5/2013 | Wargo et al. | |
| 8,920,571 B2 | 12/2014 | Benson | |
| 2002/0100132 A1 | 8/2002 | McMullen et al. | |
| 2003/0228836 A1 * | 12/2003 | Lombardo | B24B 37/22 451/533 |
| 2004/0151890 A1 * | 8/2004 | Drury | H01L 21/67046 428/304.4 |
| 2006/0151003 A1 | 7/2006 | Liou et al. | |
| 2008/0105277 A1 | 5/2008 | Boyd et al. | |
| 2011/0030158 A1 | 2/2011 | Gavney, Jr. | |
| 2013/0048018 A1 | 2/2013 | Wargo et al. | |

FOREIGN PATENT DOCUMENTS

| | | |
|---|---|---|
| FR | 1 163 859 A | 10/1958 |
| JP | S56-59016 A | 5/1981 |
| JP | S62-251054 A | 10/1987 |
| JP | S63-109979 A | 5/1988 |
| JP | H01-164546 A | 6/1989 |
| JP | H01-254110 A | 10/1989 |
| JP | H03-154771 A | 7/1991 |
| JP | H5-208371 A | 8/1993 |
| JP | H06-31637 A | 2/1994 |
| JP | H06-73814 B2 | 9/1994 |
| JP | H06-83257 U | 11/1994 |
| JP | H07-090648 A | 4/1995 |
| JP | H07-27750 U | 5/1995 |
| JP | H08-241880 A | 9/1996 |
| JP | H8-300252 A | 11/1996 |
| JP | H9-300214 A | 11/1997 |
| JP | H10-34091 A | 2/1998 |
| JP | H10-296661 A | 11/1998 |
| JP | H11-625 A | 1/1999 |
| JP | H11-312657 A | 11/1999 |
| JP | 2000-183020 A | 6/2000 |
| JP | 2001-121406 A | 5/2001 |
| JP | 2001-237209 A | 8/2001 |
| JP | 2001-358110 A | 12/2001 |
| JP | 2002-187062 A | 7/2002 |
| JP | D1334721 S | 6/2008 |
| JP | 2009-066527 A | 4/2009 |
| JP | 2009-101253 A | 5/2009 |
| WO | 99/34123 A1 | 7/1999 |

* cited by examiner

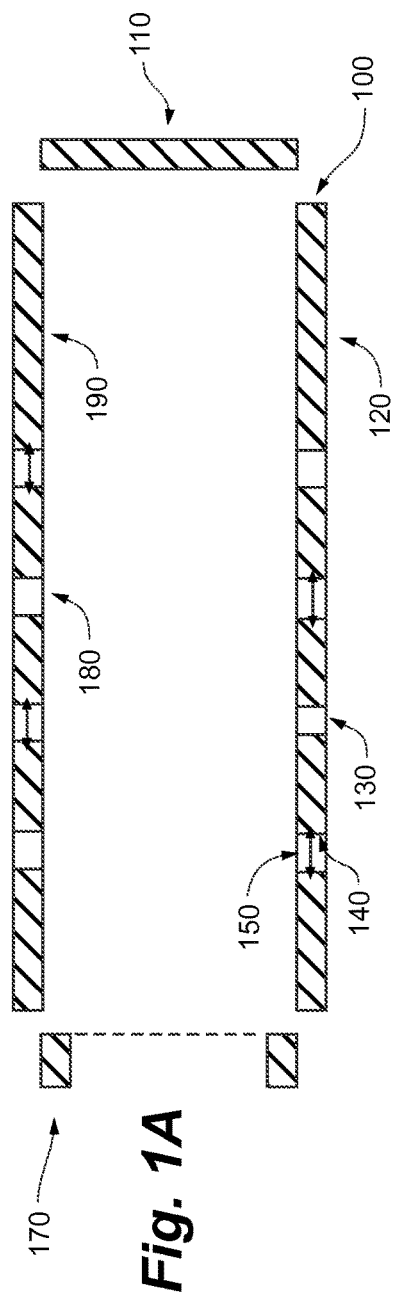
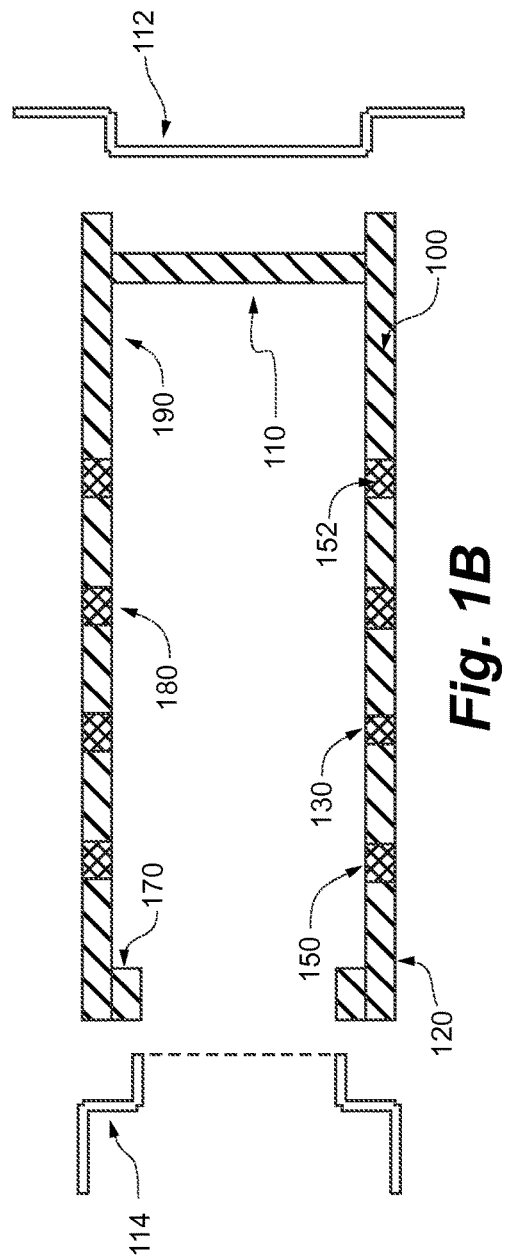

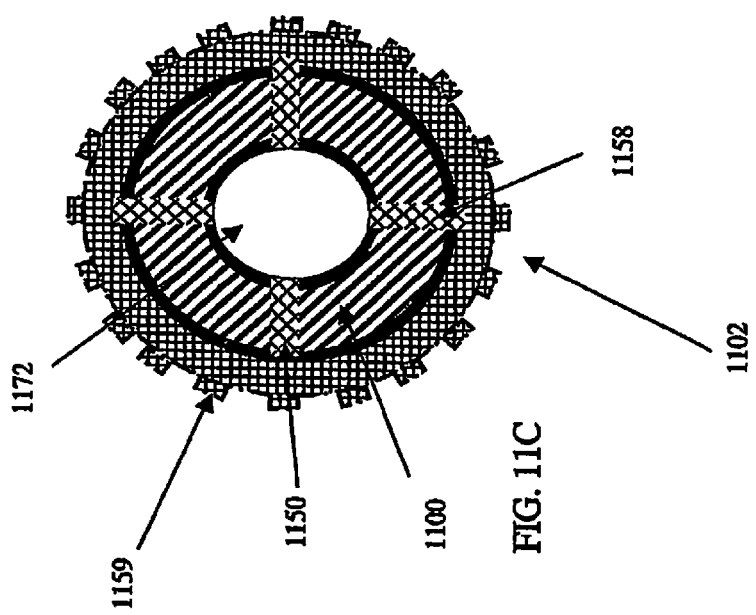
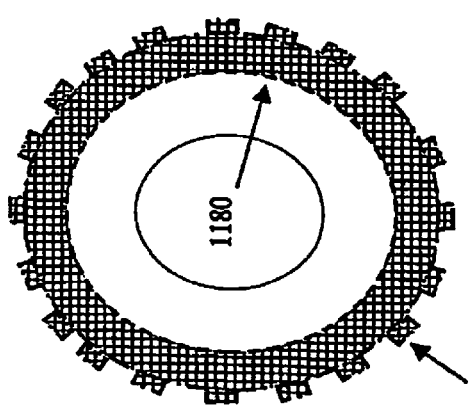
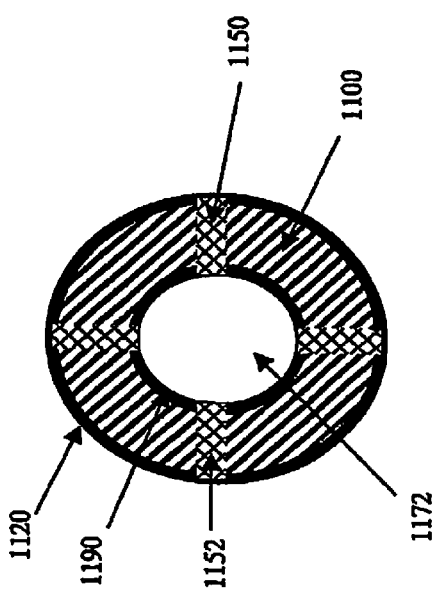
FIG. 11A
FIG. 11B
FIG. 11C

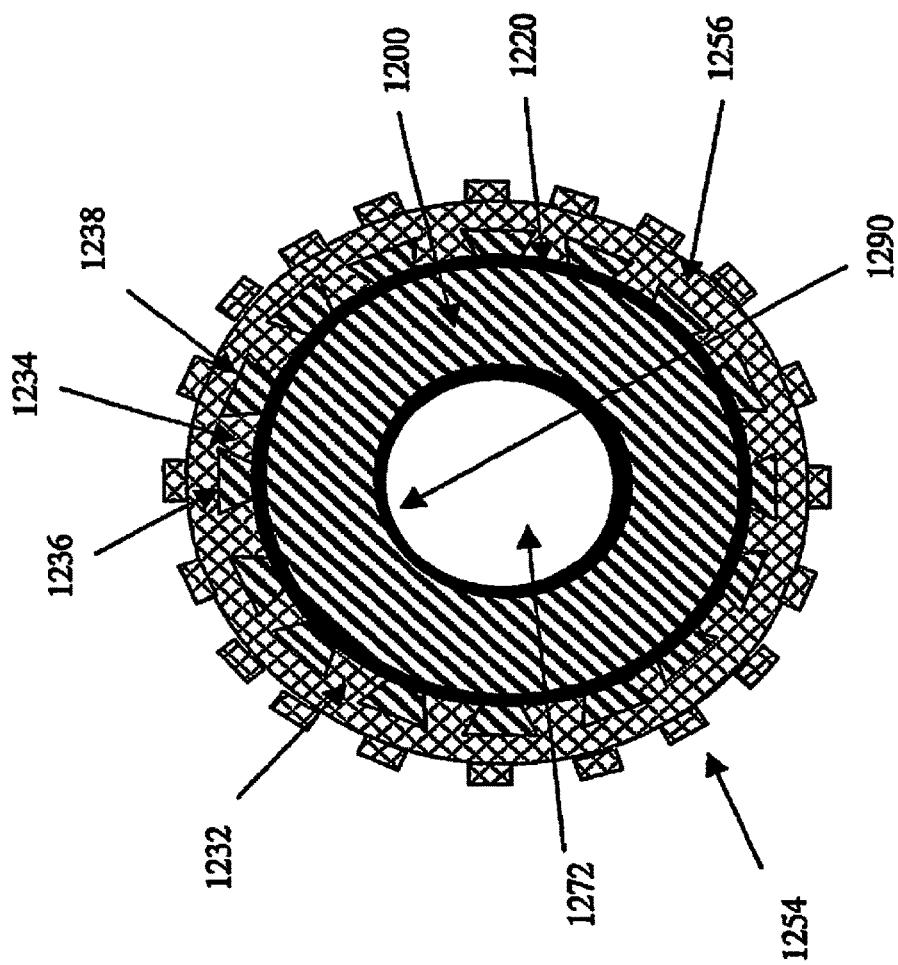

METHODS AND MATERIALS FOR MAKING A MONOLITHIC POROUS PAD CAST ONTO A ROTATABLE BASE

CROSS REFERENCES TO RELATED APPLICATIONS

This patent application is a continuation of U.S. patent application Ser. No. 14/029,471, filed Sep. 17, 2013, now U.S. Pat. No. 8,920,571, which was a continuation of U.S. patent application Ser. No. 13/190,191, filed Jul. 25, 2011, now U.S. Pat. No. 8,533,895, which was a continuation of U.S. patent application Ser. No. 10/566,847, filed Aug. 16, 2006, now U.S. Pat. No. 7,984,526, which was a 371 application based on PCT/US2004/022350, filed Jul. 13, 2004, which claimed the benefit of U.S. Provisional Patent Application Ser. No. 60/493,992, filed Aug. 8, 2003, U.S. Provisional Patent Application Ser. No. 60/493,993, filed on Aug. 8, 2003, U.S. Provisional Patent Application Ser. No. 60/493,755, filed on Aug. 8, 2003, and U.S. Provisional Patent Application Ser. No. 60/557,298, filed on Mar. 29, 2004. All of the above identified patent applications and patents are incorporated herein by reference in their entireties.

BACKGROUND

In the fabrication of semiconductor devices, there is a need to perform chemical mechanical polishing (CMP) operations and wafer cleaning. Typically, integrated circuit devices are in the form of multi-level structures. At the wafer level, transistor devices having diffusion regions are formed. In subsequent levels, metal interconnect lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material grows. Without planarization, fabrication of further interconnect and dielectric layers becomes substantially more difficult due to the higher variations in the surface topography. In semiconductor manufacturing processes, metal interconnect patterns are formed in a dielectric material on a wafer, and then, chemical mechanical planarization, CMP, operations are performed to remove the excess metal. After any such CMP operation, it is necessary that the planarized wafer be cleaned to remove particulates and contaminants.

In the manufacture of electronic devices such as integrated circuits, the presence of particulate contamination, trace metals, and mobile ions on a wafer is a serious problem. Particulate contamination can cause a wide variety of problems such as localized corrosion, scratching, and "shorts" in the integrated circuit. Mobile ion and trace metal contaminants can also lead to reliability and functional problems in the integrated circuit. The combination of these factors results in lower device yields on a wafer, thereby increasing the cost of an average functional device on the wafer. Each wafer, being at different stages of fabrication, represents a significant investment in terms of raw materials, equipment fabrication time, and associated research and development.

Chemical-mechanical polishing ("CMP") is a commonly used technique for planarizing a film on the wafer prior to subsequent processing of the wafer. CMP usually involves the introduction of a polishing slurry having 50-100 nanometer sized abrasive particles onto the surface of a polishing pad. The wafer with the layer of material, dielectric or metal, to be removed is placed against the surface of a polishing pad with a slurry. Rotating the wafer against the rotating polishing pad decrease the thickness of the layer through a combination of chemical and mechanical actions. The slurries typically are water based and can include fine abrasive particles such as silica, alumina, and other metal oxide abrasive materials. After polishing is complete, the processed wafers must be cleaned to completely remove residual slurry and other residue from the polishing process. The surface is the ready for other processing steps such as electrochemical deposition, etching, and photolithography.

To clean residual slurry material from the surface of the polished surface, especially particles less than 0.1 microns in diameter, cleaning brushes are commonly used. These cleaning brushes are usually cylindrical in shape and are rotated along a center axis of the brush. The cleaning brushes are also often made of a foam or porous polymeric material such as polyvinyl alcohol ("PVA"). The combination of rotational movement of the brush and force or pressure placed on the brush against the wafer as well as the application of cleaning fluids or deionized water causes residual slurry materials to be removed from the surface of the wafer.

These brushes have protrusion or nodes on their surface for contact and material removal from a substrate. Brushes are formed as sleeves and are slid over a core support which is used to deliver fluids to the brush and to rotate the brush. After extended use, the brush is replaced with a new brush sleeve and requires the polishing tool be stopped adding to lost productivity and downtime. Alignment of the brush protrusions along the brush core is important for consistent contact of the brush with the substrate. Asymmetric alignment and distortion of the spacing of the nodes on the sleeve is a problem with sleeve replacement. Newly installed brushes must be broken in, flushed, and gapped prior to cleaning product substrates. Often time dummy wafers are used to ensure the cleanliness, and operational stability including dimensional, rotational and contact of the brush with the dummy wafers. This non-value added step is costly for manufactures in time and dummy wafers.

To perform the cleaning operations in an automated manner, fabrication labs employ cleaning systems. The cleaning systems typically include one or more brush boxes in which wafers are scrubbed. Each brush box includes a pair of brushes, such that each brush scrubs a respective side of a wafer. To enhance the cleaning ability of such brush boxes, it is common practice to deliver cleaning fluids through the brush (TTB). TTB fluid delivery is accomplished by implementing brush cores that have a plurality of holes that allow fluids being fed into the brush core at a particular pressure to be released onto the substrate surface. The fluid is distributed from the brush core through the polymeric material and onto the substrate surface. Ideally, the chemicals flow through the bore and then flow out of the core at an equal rate from all of the brush core holes. It has been found that the chemicals delivered to the core are not flowing out of all of the holes at the same or substantially the same rate and that brush core holes near the chemical receiving end usually flow out chemicals at a substantially faster rate than holes at the opposite side of the chemical receiving end.

As semiconductor feature sizes decrease and device performance requirements continue increase, cleaning engineers are also challenged to improve their associated processes. To meet these demands, the same cleaning equipment is now being used to perform operations other than basic de-ionized (DI) water cleaning. Such operations include the application of sophisticated chemicals to remove particulates and/or to etch precise films of materials from the surfaces of a wafer. Many cleaning systems are now required to also apply reactive chemicals, such as hydrofluoric acid, uneven application will have a severe impact on the wafer being processed. For instance, if more HF is applied to one part of the wafer and less is applied to another part of the wafer, the surface of the processed wafer may exhibit variations in the amount of film removed across the wafer.

SUMMARY

Embodiments of the present invention include methods and materials for making a porous brush or pad that is cast or molded directly onto a rotatable base used to support the pad. The brush or pad can be used for coating at least a portion of a substrate with a fluid or it can be used for removing materials, particles, or chemicals from a substrate. The brush or pad includes a rotatable base or core that interlocks with a porous pad material. The base includes an inner surface and an outer surface and can have a plurality of channels in the base for interlocking the porous pad material with the base. The porous pad material covers at least a portion of the outer surface of the base and may be used for removing material from various substrates. The porous pad material has a monolithic structure and can fill one or more of the channels in the base thereby interlocking the porous pad material with the base. Preferably the channels filled with the porous pad material fluidly connect the inner surface with the outer surface of the base.

One embodiment of the present invention is a device for removing material from a substrate that includes a rotatable base supporting a porous pad material. The base includes an inner surface and an outer surface and has channels for distributing a fluid to the porous pad material from the inner surface of said base to the outer surface of the base. The porous pad material covers at least a portion of the outer surface of the base and with the fluid is used for removing materials like particle and thin films from substrates. Preferably the porous pad material interlocks with the channels of the base and more preferably it fluidly connects the inner and outer surfaces of said base. The rotatable base can have one or more fittings mated with it that interconnect the rotatable base with a source of fluid and a spindle or other fixture for rotating the base. The fittings, which may include fluid fittings and machine drive fittings are mated to the base by bonding. By using different fittings a single rotatable base may be adaptable to different material removal tools by using different sized or shaped fittings with the base.

Another embodiment the present invention is a device for removing material from a substrate that includes a rotatable base supporting a porous pad material having protrusions or nodes on its surface. The rotatable base includes an inner surface and an outer surface and has channels for distributing a fluid to a substrate through the protrusion bearing porous pad material. The fluid flows from the inner surface of the base to the outer surface of the base. The porous pad material covers at least a portion of the outer surface of the base, and with the fluid, can be used for removing materials like particle and thin films from substrates. The rotatable base has one or more fittings mated with it which interconnect the rotatable base with a source of fluid and a spindle or other fixture for rotating the base. Preferably the porous pad material interlocks with the channels of the base and more preferably it fluidly connects the inner and outer surfaces of the base. The fittings, which may include fluid fittings and machine drive fittings can be mated to the base by bonding. By using different fittings, a single rotatable base may be adaptable to different material coating and removal tools by using different sized or shaped fittings with the base. The rotatable base may be a brush for scrubbing semiconductor wafers.

Embodiments of the present invention are directed to methods of cleaning substrates by contacting them with a rotating porous pad material cast or molded onto a rotatable base core. The pad covering the rotatable base includes an inner surface and an outer surface and a plurality of channels in the base for interlocking the porous pad material with the base. The porous pad material covering at least a portion of the outer surface of the base can be used for removing material from a variety of substrates. In the process a material removal or cleaning fluid is deposited onto a surface of the substrate through the brush. Through rotation of the brush and action of the fluid, material can be removed from the substrate surface by rotating the porous pad material against the substrate. Preferably the channels in the base are filled with the porous pad material to interlock the porous pad with the base and fluidly interconnect the inner surface with the outer surface of the base to distribute the fluid to the pad surface. The method may further including the act of flushing a fluid through the porous pad cast onto the rotatable core to remove substrate material adhering to the porous pad and its protrusions or nodes. One or more surfaces of the substrate may have material removed from them by contacting each with a rotating porous pad molded onto a rotatable base along with a fluid.

Preferably the porous pad material molded onto the base includes protrusions like bristles or nodes or it may have surface recesses like grooves. Preferably the porous pad material covers the inner surface of the rotatable base core. The channels of the base preferably fluidly connect the inner surface of the core with the outer surface of the core and one or more of the channels are filled with the porous pad material which interlocks the base with the porous pad material and maintains the alignment of nodes on the porous pad during rotations. Fluid may be deposited onto the substrate through the core of the rotatable base by flowing fluid through the porous pad filled channels and out to the substrate surface.

Materials removed from the substrate by embodiment of the present invention may include thin film metal oxide films, silica films, semiconductor oxide films, particles of various composition, or chemical residues. Preferably the substrate is a wafer which includes copper or copper interconnects. Brushes of the present invention may be used to clean memory media and wafers regardless of texture or type sputtered metal on the wafer.

In another embodiment, the brush or pad includes a rotatable base for supporting a porous pad material cast or molded onto the base. The base includes an inner surface and an outer surface and has a plurality of channels fluidly interlocking the porous pad material with the base. The porous pad material covering at least a portion of the outer surface of the base and has surface protrusions or recesses. The porous pad material having the surface protrusions preferably fills one or more of through channels in the base to distribute fluid from the inner surface of the base to the outer surface of the base through the porous pad material. Preferably the porous pad material interlocking with the channels and covering the outer surface of the base forms a monolithic structure.

In another embodiment, the brush or pad includes a rotatable base for supporting a porous pad material cast or molded onto the base. The base includes an inner surface and an outer surface and a plurality of channels in the base for interlocking the porous pad material with the base. Preferably the channels fluidly connect the inner surface with the outer surface of the base. To aid in the distribution of fluid from the inner surface of the base to the porous pad covering the outer surface of the base, through channels may be positioned throughout the base from a center point of the base to an outer edge of the base that may be interconnected by surface channels. The porous pad material covers at least a portion of the outer surface of the base and the porous pad material fills one or more of the through channels and or surface channels in the base to distribute fluid from the inner surface of the base to the outer surface of the base through the porous pad material. Preferably the porous pad material in the through channels and covering the outer surface of the base form a monolithic structure.

One embodiment of the present invention is an article having a rotatable base with an adherent porous pad material covering at least a portion, and preferably all of the rotatable base surface including through holes in the base. The adherent porous pad material covering the rotatable base may include a first porous pad material covering at least a portion, and preferably all of the rotatable base surface that adheres to the rotatable base and permits fluid flow through the base and porous pad. The adherent porous pad material on the base may have a second adherent layer of porous pad material molded or cast onto the first adherent layer. Optionally one or more through holes in the base may also be filed with a the porous pad material. The adherent porous pad material a covering at least a portion of the outer base surface maintains its porosity after bonding to the base surface and permits fluid flow from the core of the rotatable base through holes or channels in the base to the outer porous pad surface layer which may be used for applying fluid to a substrate, removing films from a substrate, or cleaning a substrate.

In another embodiment of the present invention, the porous pad material is deposited by casting or molding into recessed channels or through holes in the base. The channels and through holes in the housing base interlock with the porous pad material and prevent lifting of the porous pad material from the base surface during use. The channels may have an optional adherent porous first layer onto which a second porous layer is cast. The interlocking of the porous pad material with the base also aids in maintaining the height and the position of the protrusions or nodes of the porous pad material along the base surface or its axis and provides more uniform contact of the nodes with the substrate surface. The interlocking of the porous pad material and the housing base also eliminates or substantially reduces the twisting of brush rollers that commonly occurs with brushes sleeves which are slipped onto a base housing or which are placed on two part base housings. The twisting of sleeve type brushes and rollers may lead to non-uniform and irreproducible substrate surface fluid contact, uneven material removal or cleaning as well as accelerated brush wear. Monolithically formed porous pad material interlocked with the rotatable base maintains node alignment straight, eliminates or reduces ripping of nodes during mounting, and permits much higher tolerance on node size and shape giving more uniform contact with the substrate to be treated. Preferably the channels filled with the porous pad material fluidly connect the inner and outer surfaces of the base.

Embodiments of the present invention include methods and materials for making a brush or pad that is cast or molded directly onto the core used to support the pad. The pad or brush can be used for removing materials, particles, or chemicals from a substrate. The brush or pad includes a rotatable base or core for supporting a porous pad material. The base include an inner surface and an outer surface and a plurality of channels in the base for interlocking the porous pad material with the base. The porous pad material covers at least a portion of the outer surface of the base and is used for removing material from various substrates. The porous pad material has a monolithic structure and fills one or more of the channels in the base and interlocks the porous pad material with the base. Preferably the channels fluidly connect the inner surface with the outer surface of the base.

The channels in the base to which the porous pad material is interlocked by casting or molding maintains the alignment of the porous pad material on the rotating base, more preferably the casting or molding of the pad maintains the integrity, alignment, and spatial distribution or nodules of the porous pad material on the rotating base. Channels which interconnect the inner and outer surfaces also aid in the distribution of fluid from the inner surface of the base to the outer surface of the base having the porous pad material in contact with the substrate. Preferably the porous pad material in the channels, the inner base surface, and that covering the outer surface of the base are monolithic in structure. The substrate can be any substrate that may need to undergo a scrubbing to complete a cleaning operation or a substrate that is planarized by an etching operation, or other preparation. For instance, the substrate can be a semiconductor wafer, a disk, optical lenses, a flat panel display. Preferably the substrate will benefit from a brush or pad that can deliver substantially uniform and controlled amounts of fluid to the substrate. Even more preferably the substrate will benefit from surface material removal or cleaning with a brush or pad that can deliver substantially uniform and controlled amounts of fluid to the substrate and maintain consistent and uniform contact of the protrusions on the pad with the substrate.

In another embodiment, a method is provided for making the brush or pad such that the porous pad material covering the base and the porous foam material filling the through channels of the base are monolithic. Preferably the method includes forming a monolithic porous pad material on the outside of the base which also interlocks with channels on the base. The method includes pouring a combination of un-polymerized porous base monomer and a catalyst into a mold including the base, filling one or more channels in the base, and then curing the combination to form the article. The article is released from the mold. In another embodiment, a method is provided for making the brush or pad such that the porous pad material covering the base and the porous foam material filling the through channels of the base are monolithic. Preferably the method includes forming a monolithic porous pad material on the outside of the base which also interlocks with channels of the base. The method includes pouring a combination of un-polymerized porous base monomer and a catalyst into a mold including the base, filling one or more channels in the base, and then curing the combination to form the article. The article is released from mold. Preferably the mold is treated with a release agent to aid in the release of the monolithic porous pad structure.

Embodiments of the present invention may be used to apply coatings to substrates or as brushes for removing particles, thin film, or chemical residues from a wide variety of substrates such as but not limited to semiconductor wafers, flat panel displays, hard disks, and optical devices such as lenses. Advantageously embodiments of the present invention permit great flexibility in the manufacturing and assembly of such brushes. This is because a single base with a porous pad can be used on an number of tools. In the present invention, brushes may be mounted on a variety of cleaning tools by simply changing the one or more fittings that are to be connected to the rotatable base so that the rotatable base and pad can perform their function of cleaning or removing material from the one or more surfaces of the substrates.

Advantageously, embodiments of the present invention may be used to provide a fluid to the surface of a substrate for a cleaning or material removal operation such as a chemical mechanical planarization or post CMP scrubbing processes. By interlocking the porous pad material with the base, the porous pad material in held in place relative to the base. Node misalignment and twisting in embodiments of the present invention substantially reduces or eliminated brush walking and twisting compared to slip on sleeve style brushes. An additional advantage of the present invention is that it may be used to distribute fluid to both roller and pad type base fixtures. The porous pad material in the channels may also be used to control the liquid flow from the fluid source to the substrate. This allows the number of perforations or through channels in the housing core to be decreased and their size or surface area increased without significantly increasing the overall amount of liquid used. This is particularly advantageous since larger perforations or through channels in the housing reduces localized nonuniform flushing of the porous pad. Further, by restricting the flow of liquid, the porous pad causes a uniform pressure buildup inside of the distributor. This in turn can be used to form through holes that ensure that both ends of the brush receive the same amount of liquid and are uniformly flushed which improves particulate removal from the brush and reduces or eliminates uneven wear of the brush.

An advantage of a brush cast onto a disposable core is that the core and brush are joined together eliminating the slippage, expansion, and loss of concentricity observed with brushes friction fit onto a core. The brush cast onto the core eliminates the need for special mounting stand and time associated with mounting friction brush sleeves onto cores.

DESCRIPTION OF THE DRAWINGS

In part, other aspects, features, benefits and advantages of the embodiments of the present invention will be apparent with regard to the following description, appended claims and accompanying drawings where:

FIG. 1A illustrates a cross section along the length of a hollow cylindrical tube with through channels useful for a rotatable base in an embodiment of the present invention; FIG. 1B is an illustration of the hollow cylindrical tube with one or more through channels filled with a porous pad material.

FIG. 11A illustrates a cross section of a brush pad with protrusions; FIG. 11B illustrates a cross section along the diameter of a hollow tube housing base in an embodiment of the present invention with hollow through channels filled with a porous material; FIG. 11C illustrates a brush formed by combining the components in FIG. 11A and FIG. 11B;

FIG. 12 illustrates a cross section of a housing base tube having channel grooves in a rotatable base surface for interlocking with the porous base material and retaining the alignment and position of nodes on the surface of a porous pad material covering the base surface;

DETAILED DESCRIPTION

Figure 1C:
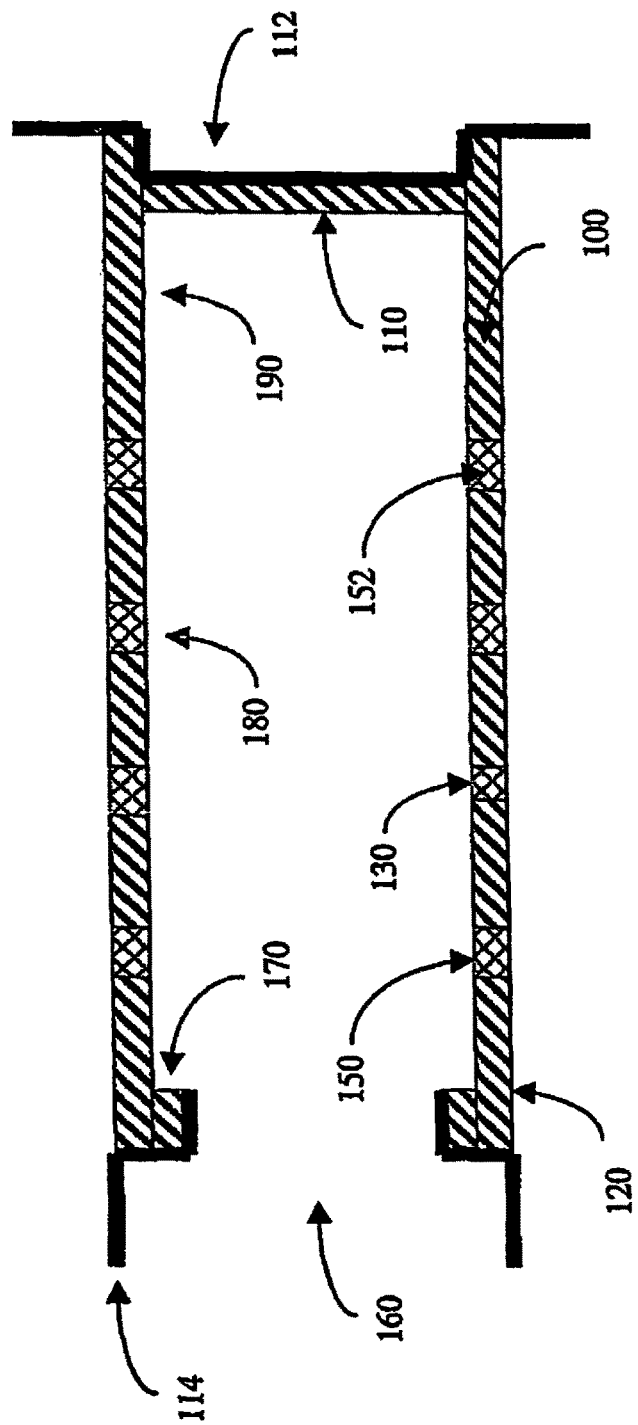
FIG. 1C illustrates a rotatable base with filled through channels including fluid fittings and tool mounting fitting.

Before the present compositions and methods are described, it is to be understood that this invention is not limited to the particular molecules, compositions, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "channel" is a reference to one or more channels and equivalents thereof known to those skilled in the art, and so forth. Unless defined otherwise, all technical and scientific terms used herein have the same meanings as commonly understood by one of ordinary skill in the art. Although any methods and materials similar or equivalent to those described herein can be used in the practice or testing of embodiments of the present invention, the preferred methods, devices, and materials are now described. All publications mentioned herein are incorporated by reference. Nothing herein is to be construed as an admission that the invention is not entitled to antedate such disclosure by virtue of prior invention.

Although the present invention is described in conjunction with the scrubbing of a semiconductor substrate or wafer, it will be appreciated that other substrates may be processed or coated by the methods and apparatuses of the present invention. Further, it will be appreciated that reference to a semiconductor substrate or wafer may include a bare or pure semiconductor substrate, with or without doping, a semiconductor substrate with epitaxial layers, a semiconductor substrate incorporating one or more device layers at any stage of processing, substrates including copper or copper alloy interconnects, other types of substrates incorporating one or more semiconductor layers such as substrates having semiconductor on insulator (SIO) devices, or substrates for processing other apparatuses and devices such as flat panel displays, MEMS devices, multichip modules, etc.

It will be clear to one of ordinary skill in the art that some of the steps in the cleaning system described herein may occur in another order and/or with various solutions depending upon the substrate or substrate layer being cleaned. For example, different cleaning solutions, such as water, water and isopropyl alcohol, citric acid, ammonium hydroxide, ammonium citrate, and hydrofluoric acid solution (or mixtures of solutions) may be used in one of the brush stations. Also, other systems may include one brush station, or two or more than two brush stations. Moreover, other systems may omit one or more of the above stations/steps and may include additional processing stations, such as a CMP station.

Sponges or brushes in the form of replaceable sleeves have problems with walking and twisting on their brush cores and have shorter brush life. Rotation rates for brushes generally range from about 800 to 1500 rpm with from about 0.8 to 2 pounds of drag. Higher rotation rates and drag are often preferred to clean an article at a faster rate, however this may lead to rapid degradation of nodes on the brush or pad. Cast on the core brushes described in embodiments of the present invention can be rotated at greater radial velocities because they cannot walk or twist due to interlocking of the base core with the porous pad material. Walking refers to stress induced migration of the brush to a different location on the core. Twisting refers to stress induced relocation of nodules out their original alignment.

Cleaning and material removal solutions which may be used with the method of the present invention include but are not limited to deionized water and mixture of chemicals in deionized water. The chemicals may include fluoride compound such as HF or $NH_4F$; $NH_4OH$, an organic acid, an ammonium salt of an organic acid, alcohols, an anionic surfactant; a basic, a neutral, or an acidic pH environment. For example hydrochloric acid (HCl) may be added to the solution to adjust pH and help dissolve surface coatings like copper oxide. One example of the many different ways in formulating the cleaning solution is combining 0.5% HF, 0.1% Citric Acid, and 0.4% $NH_4OH$ by weight mixed in deionized water. The pH level of the solution in this example is approximately 3. EDTA, oxalic acid, deionized (DI) water or corrosion inhibitors such as benzotriazole may also be used in such cleaning solutions. It should be noted however, that the present invention is not limited by formulations of the cleaning solution, and that each component in the solution may be replaced by different chemical that has similar properties.

A method of cleaning a surface of a semiconductor wafer after a chemical mechanical polishing (CMP) operation includes the steps of applying a cleaning or material removal chemical to the surface of the semiconductor wafer and preferably through a brush that is cast onto a base core. Preferably the porous pad material fills one or more through holes of the rotatable base and forms an interlocking monolithic structure with porous pad material on the surface of the base. Even more preferably the porous pad material fills one or more through holes of the rotatable base and forms an interlocking monolithic structure with porous pad material on the inner and the outer surface of the base. Brushes with interlocking porous pad and base structures but without through channels in the base may have cleaning and material removal chemicals applied to the surface of the substrate by a spray nozzle. Preferably the brush has a porous pad material forming a monolithic interlocking structure with the base. The semiconductor wafer may have copper interconnects wherein the cleaning chemical transforming the copper layer on the surface of the semiconductor wafer into a water soluble copper oxide layer. Scrubbing the surface of the semiconductor wafer having the cleaning chemical fluid with a brush that has a porous pad material cast onto a base and forms a monolithic interlocking structure with a base may be used to, but is not limited to, removal of from between about 100 angstroms and about 150 angstroms of the copper oxide layer from the surface of the semiconductor wafer. The treated wafer and brush may be further treated by rinsing the semiconductor wafer and the brush with deionized water to remove the water soluble copper oxide from the surface of the semiconductor wafer and the brush prior to cleaning or treating a second semiconductor wafer. The fluid application, the scrubbing, and the rinsing steps can be performed in a brush box. The treated substrate will have a copper oxide layer having a thickness between about 5 angstroms and about 30 angstroms on the surface of the semiconductor wafer.

A method of cleaning a surface of a semiconductor wafer after a chemical mechanical polishing (CMP) operation may further include controlling the amount of the copper oxide layer remaining on the surface of the semiconductor wafer by controlling an amount of $H_2O_2$ in the cleaning chemical that flows through the brush cast onto the core.

A brush cast onto a core base such that the porous pad material forming the brush is interlocked with channels in the base may be used to remove an ultra-thin chemical oxide layer, such as $SiO_2$, from a substrate as part of a post CMP cleaning process. In this process, an acid such as hydrofluoric acid is delivered to the core of the cast on core brush where it flows through the porous pad material in the through channels of the base core to the surface of the brush. Alternatively the acid may be applied to the surface of the wafer using a sprayer.

Less than 20 angstroms of such oxides may be etched using very dilute HF and brushes interlocked with a rotatable base. Hydrofluoric acid with a concentration of about 0.005% HF. can be used to perform a controlled removal of less than approximately 15 angstroms of the oxide. This oxide removes contaminants, including particles and plated residues, on the surface of the oxide layer or within the oxide layer, without making the surface hydrophobic. A thin layer of oxide remains on the surface of the workpiece so that the surface remains hydrophilic. To clean thicker oxide layers, e.g., greater than approximately 30 angstroms, a controlled thin oxide etch may be used. For these applications, removal of metallic particle contamination (which may be incorporated into the oxide from the CMP polishing process) is important. The metallic particle contamination may diffuse into the microelectronic devices on the workpiece and cause them to fail. Very dilute concentrations of HF (such as 0.005% HF) may be sufficient to remove metallic contamination, depending upon the depth of penetration of the contamination into the oxide layer. For example, if the metallic contamination is more than 20 angstroms below the surface, a higher concentration of HF may be needed. The amount of oxide removed is determined by the concentration of HF delivered to the brush, the dispense flow rate, and time. For removing less than 15 angstroms of a native oxide layer, a 0.005% concentration of HF may have a slow etch rate, with etch times of 20-60 seconds being acceptable. The film etch time is important when using higher concentrations. The concentration of HF can be adjusted to provide an oxide layer removal rate which is consistent with a desired workpiece throughput or production rate. For back-end CMP processes, removal of up to 100 angstroms of oxide may be required to adequately remove the metallic contamination incorporated therein by the polishing process. To remove this amount of oxide in less than approximately 40 or 50 seconds, the concentration of HF is increased to 0.5-1.0%.

FIG. 1A illustrates a cross section along the length of a hollow cylindrical tube base 100 with various exemplary through channels 130, 150, and 180 for permitting fluid flow between the inner surface 190 of the tube with outside surface 120. The through channels may be different in size as illustrated by 130 and 150. The through holes may include a roughened surface or a non-limiting example of a notch 140 for increasing adhesion or interlocking of the a porous foam or pad material used to fill the through channels. An endcap 110 may be optionally used to close one end of the cylinder during molding and is also useful for mounting the finished housing tube to a tool. The endcap 110 will cause a source of feed fluid (not shown) to flow through the channels 130, 150, and 180. Optional insert 170 may be used to offset the inside diameter of the tube for subsequent insertion of a fluid fitting or a step or series of steps with diameter greater than the inner diameter of the base, not shown, may be machined into the base 100 for mating with fluid and machine drive fittings. Endcap 110 and insert 170 may be bonded, molded, or machined into the base 100 and preferably form a fluid tight seal. The endcap 110 and inner surface 190 define a volume for holding a fluid.

FIG. 1B illustrates the hollow cylindrical tube 100 with one or more non-limiting examples of through channels 130, 150, 180 filled with a porous pad material 152. The porous material 152 is shown just filling the through channels so that inner surface 190 and outer surface 120 remain substantially free of the porous material 152. In FIG. 1B, the insert 170 and endcap 110 are shown positioned inside the base. Fluid fitting 114 and machine tool mounting plate 112 are shown prior to being mounted to the base.

Figure 2:
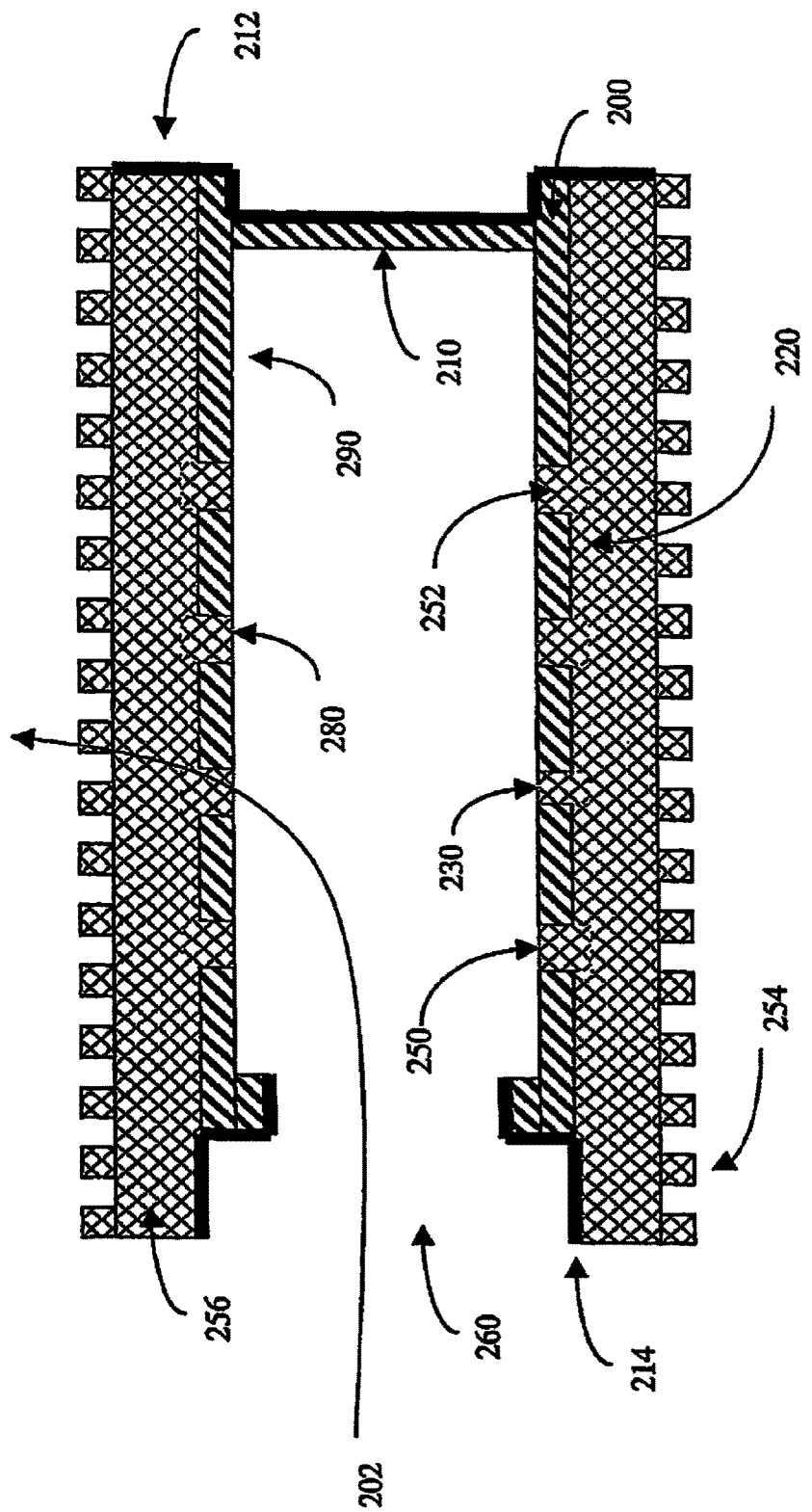
FIG. 2 is a schematic illustration of a cross section along the length of a hollow cylindrical housing base in an embodiment of the present invention with through channels and the outer surface of the base including a porous pad material with optional protrusions on the pad surface.

FIG. 1C illustrates the base 100 with through channels 130, 150, and 180 filled with a porous material 152. The porous material 152 is shown just filling the through channels so that inner surface 190 and outer surface 120 remain substantially free of the porous material 152. The fluid fitting 114 and machine tool drive mounting plate 112 are shown mounted to the base 100. Fluid fittings permit flow of fluid from a source (not shown) into the core of the base; machine mounting fittings permit the rotatable base 100 to be connected to a rotating spindle or fixture for rotating the base in a cleaning or material removal process. Inlet for fluid 106 is provided for by fluid fitting 114. The embodiment shown in FIG. 1C may be covered with a sleeve of a second porous pad material (not shown) cast on the base 100, to form a brush roller. Such a brush roller may be installed in a CMP cleaning tool. In use as a cylindrical brush, a source of pressurized fluid would be connected to fluid inlet fitting 114. Fluid would flow into the device through inlet 160, pass through inlet 160 and into the core volume defined by endcap 110 and the inner surface 190 of base 100. Fluid would flow out of the exemplary flow channels 130, 150, and 180 filled with the porous pad material 152 and out to the second porous pad layer. The machine tool plate 112 would be connected to a rotating shaft or spindle of the tool to rotate the brush against the FIG. 2 is a schematic illustration of a cross section along the length of a hollow cylindrical housing base 200 that has a porous pad material cast onto the base core. Exemplary through channels 230, 250, and 280 are filled with a porous material 252 in a mold which also forms a layer 256 of the porous pad material on the outer base surface 220. The porous pad material 252 and 256 interlock with the base through holes and optional surface channels (not shown) to maintain the position and spacing of the protrusions 254 on the pad surface. By interlocking the channels in base with the porous pad, the movement of the pad by walking or twisting is reduced or eliminated. The porous pad 252 interlock with the channels of the base by filling one or more of the channels and preferably form a monolithic structure with 256 and 254. Preferably the channels or surface of the base have a shape to mechanically and physically prevent the porous pad cast or molded into the channels from being removed by pulling or twisting of the porous pad during rotation. Optional protrusions 254 are shown covering the porous layer 256. Besides protrusions, the porous layer may have but is not limited to recessed grooves or a flat surface. In the FIG. 2 the porous pad materials 252, 254, and 256 are preferably all the same material and form a continuous monolithic structure from a molding process. Optional fluid fitting 214 and machine tool mounting plate 212 are shown connected to the base 200. Base 200 inner surface 290 remains substantially free of the porous material. In use as a cylindrical brush, a source of pressurized fluid would be connected to fluid inlet fitting 214. Fluid would flow into the device through inlet 260, as illustrate by 202, pass through inlet 260 and into the core volume defined by endcap 210 and the inner surface 290 of base 200. Fluid would flow out of the flow channels filled with the porous pad material, for example illustrated by channel 280, and out to the porous pad layer 256 to be deposited on the substrate.

Figure 3A:
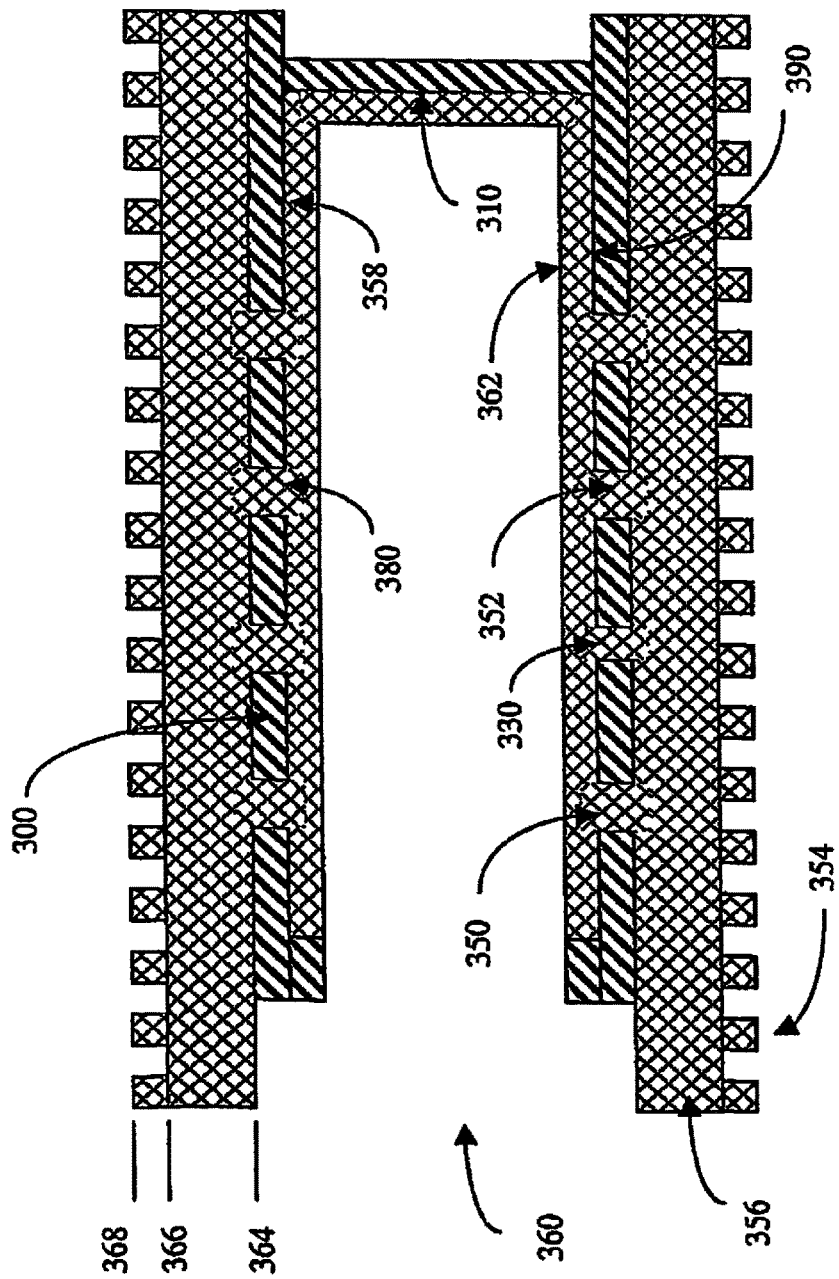
FIG. 3A is a schematic illustration of a cross section along the length of a hollow cylindrical housing base in an embodiment of the present invention with through channels, the inner surface, and the outer surface of the base including a filling or covering of a porous pad material without fluid fitting or a fitting for connection of the base to a cleaning tool.
Figure 3B:
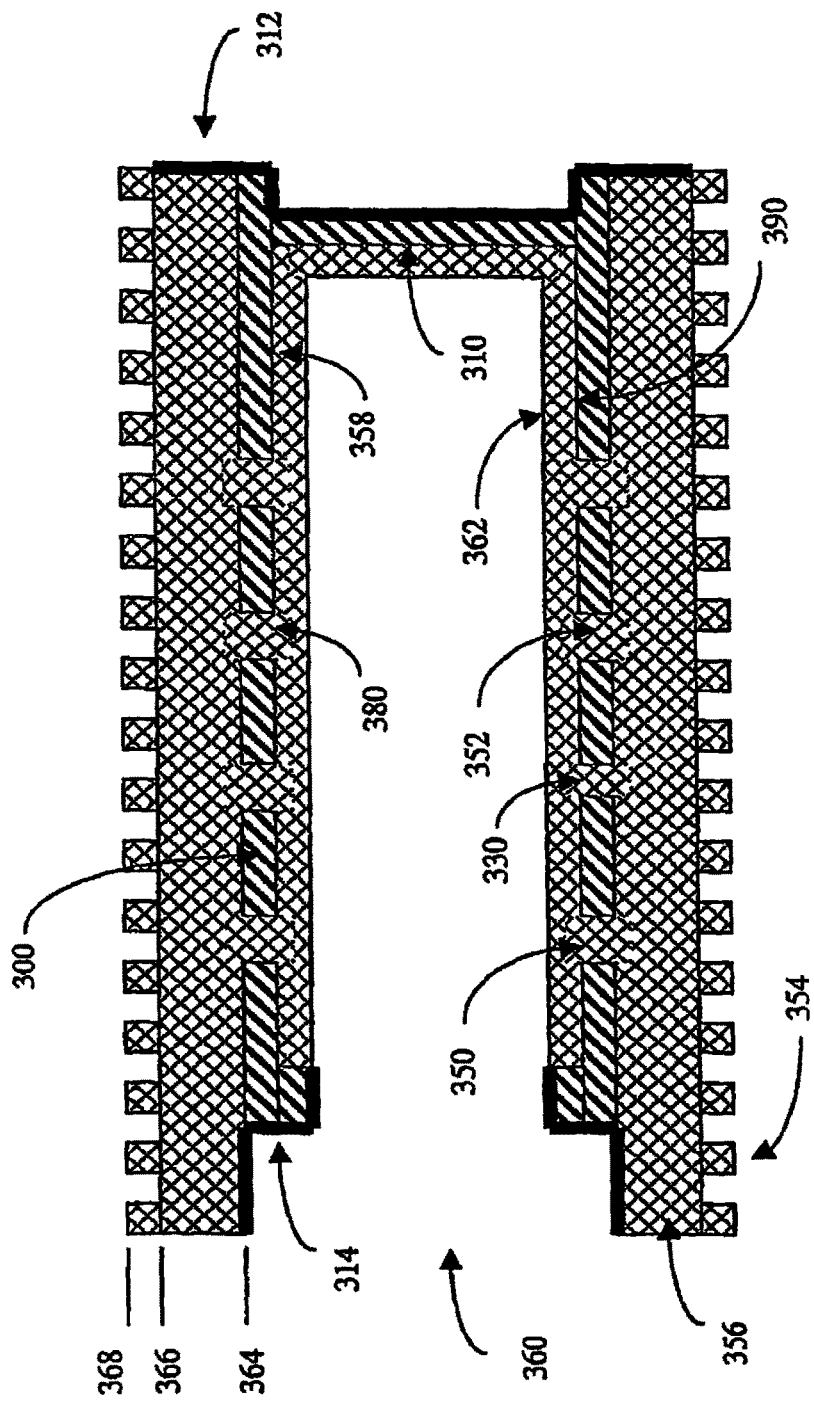
FIG. 3B is a schematic illustration of a cross section along the length of a hollow cylindrical housing base in an embodiment of the present invention with through channels, the inner surface, and the outer surface of the base including a filling or covering of a porous pad material with fluid fitting and a fitting for connection of the base to a cleaning tool.

FIG. 3B is a schematic illustration of a cross section along the length of a hollow cylindrical housing base 300 with through exemplary channels 330, 350, and 380 as well as the inner surface 390 and outer surface 320 of the base filled or covered with the porous pad material. Through channels illustrated by 330, 350, and 380 are filled with a porous material 352 in a mold which also forms layers 356 and 358 of the porous pad material on base surfaces 320 and inner surface 390. The porous pad material interlocks with the through channels of the base 300. Optional protrusions 354 are shown covering the porous layer 356. Besides protrusions, the porous layer may have but is not limited to recessed grooves or a flat surface. In the FIG. 3B the materials 352, 354, 356, and 358 are preferably all the same and form a continuous monolithic structure in a molding or casting process. The porous base material 352 and 356 that fills at least a portion of the exemplary channels 350 and 330 act to prevent lifting of the porous pad material 356 and 354 from the base surface during use. It also aids in maintaining the height and the position of the protrusions or nodes 354 along the base surface or its axis and provides more uniform contact with the substrate surface. Optional fluid fitting 314 and machine tool mounting plate 312 are shown connected to the base 300 in FIG. 3B; FIG. 3A illustrates an embodiment of FIG. 3B without fluid fitting and machine drive fitting. Porous pad material layer 358 inside the base has a thickness measured between pad inner surface 362 and base inner base surface 390. Porous pad layer 356 has thickness measured between 366 and 364. Protrusions 354 have a height measured between 368 and 366. The thickness of the porous pad layers 354, 356, and 358 may be varied by changing the shape and dimensions of the mold. In use as a cylindrical brush, a source of pressurized fluid would be connected to fluid inlet fitting 314. Fluid would flow into the device through inlet 360 and into the core defined by endcap 310 and the inner surface 390 of base 300. Fluid would flow out of the flow channels such as 330 filled with the porous material and then distributed out to the porous pad layer 356 and protrusions 354. FIG. 3A does not have fluid or tool fittings 314 and 312 mounted to the base 300 and plate 310.

Figure 4:
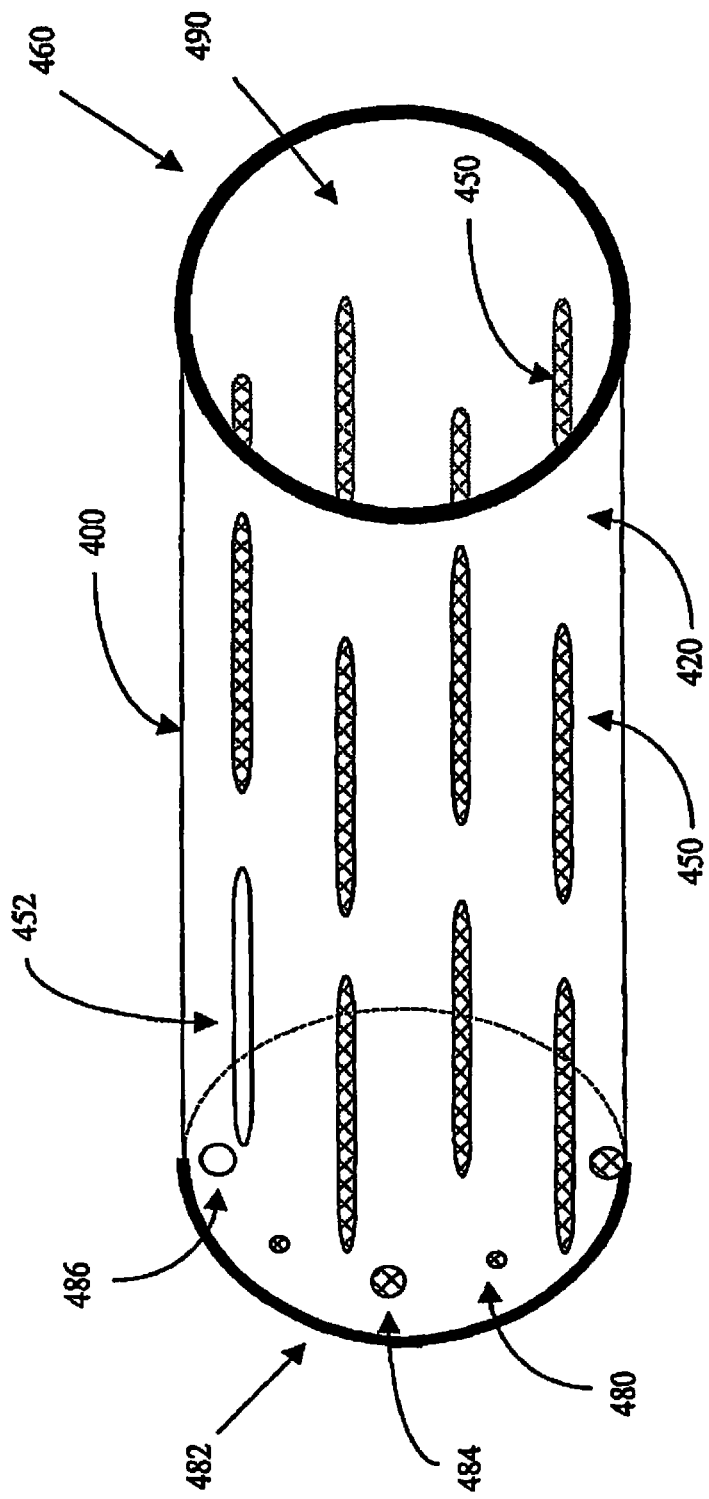
FIG. 4 is a schematic diagram of a hollow cylindrical tube useful in as a base or core for embodiments of the present invention illustrating different through channels filled with a porous pad material.

FIG. 4 is a schematic diagram illustrating non-limiting through channels filled with a porous pad material useful in the practice of the invention. Base housing 400 is a cylinder with inlet 460 and outlet 482, optionally outlet 482 is covered with an endcap (not shown). The inner surface 490 and outer surface 420 are fluidly connected by through channels 450 and 452 and or pores 480, 486 and 484. In FIG. 4 the different sized illustrative pores 480 and 484 are shown filled with the porous pad material while pore 486 is not filled. Through channel 452 is shown not filled and through channel 450 is shown filled with the porous pad material. Preferably the pores and through channels in the base 400 are filled with the porous pad material. Also shown is a distribution of through channels and pores along the base 400 to aid in the preferential distribution of fluid from the inside of the base to the outer surface of the base and into a porous pad material covering the base which is not shown.

Figure 5A:
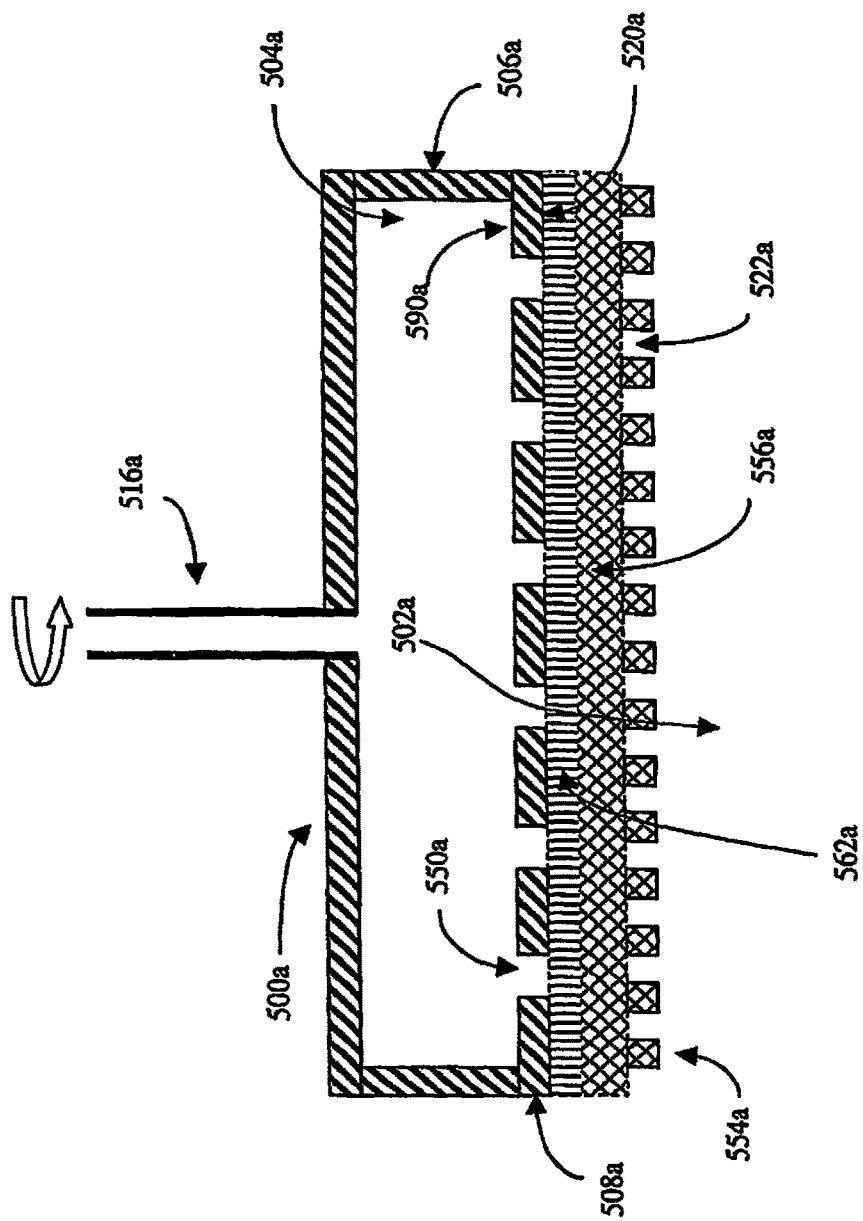
FIG. 5A is a schematic diagram of a rotatable base in the form of a disk shape housing in an embodiment of the present invention with an adherent porous pad layer covering the rotatable base and a second adherent porous pad material molded or cast onto the first adherent porous pad layer.

The present invention may also be used as a pad for material removal or cleaning of a substrate. FIG. 5A illustrates a cross section along the diameter of a disk shaped housing base 508a having sides 506a and top 500a to form a volume 504a. A hollow rod 516a connected to top 500a through an optional machine drive or fluid mounting plate which is not shown. Rod 516a is used to deliver fluid to the pad 556a and to rotate the device. Fluid from a pressurized source illustrated by 502a enters the device cavity 504a through the rod 516a and flows through inner porous pad layer 562a adhering to the base 508a with inner surface 590a and an outer surface 520a. The fluid flows from 504a through channels 550a, adhering porous pad layer 562a, and second porous pad layer 556a, and to porous protrusions 554a. The first porous pad material 562a adheres to the base surface 520a and second porous pad layer 556a and bonds the porous pad material 556a with the base 508a. The porous pad layer preferably covers through holes 550a, but it may also fill one or more of the through holes 550a. Optionally the porous pad material 562a and 556a form a single adherent porous pad material bonded to the base 508a. Porous pad layer 556a covers outer surface 520a of base 508a and may have surface recess features 522a. The porous materials 558a, 562a are preferably all the same material composition and form a continuous monolithic structure from a molding or casting process.

Figure 5B:
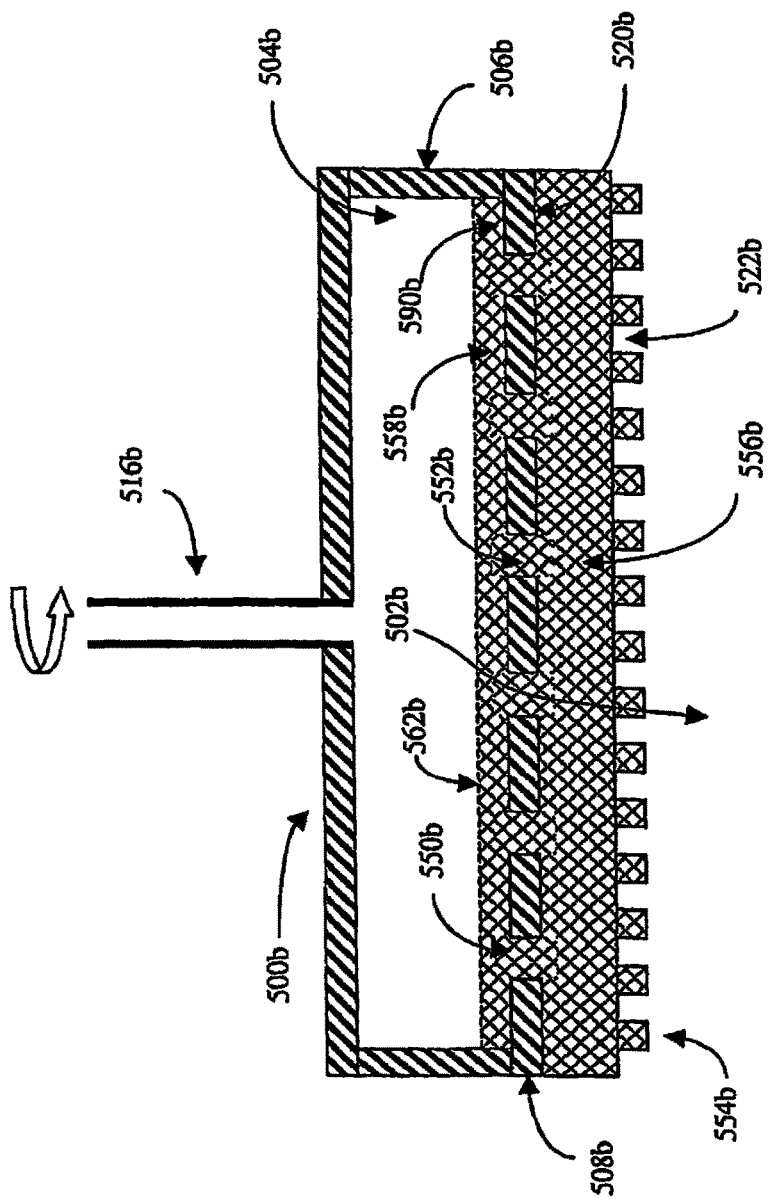
FIG. 5B is a schematic illustration of a cross section along the diameter of a disk shaped housing base in an embodiment of the present invention with through channels, the inner surface and the outer surface of the rotatable base including a filling or covering of a porous pad material.

The present invention may also be used as a pad for material removal or cleaning of a substrate. FIG. 5B illustrates a cross section along the diameter of a disk shaped housing base 508b having sides 506b and top 500b to form a volume 504b. A hollow rod 516b connected to top 500b through an optional machine drive or fluid mounting plate which is not shown. Rod 516b is used to deliver fluid to the pad 556b and to rotate the device. Fluid from a pressurized source illustrated by 502b enters the device cavity 504b through the rod 516b and flows through inner porous pad layer 558b, into exemplary through channels 550b, pad layer 556b, and to porous protrusions 554b. The porous pad material filling the through hole 550b interlocks the pad material with the base 508b. Porous pad layer has top surface 562b and covers inner surface 590b of the base 508b. Porous pad layer 556b covers outer surface 520b of base 508b and may have surface recess features 522b. The porous materials 558b, 552b, 554b, and 556b are preferably all the same material composition and form a continuous monolithic structure from a molding process.

Figure 7:
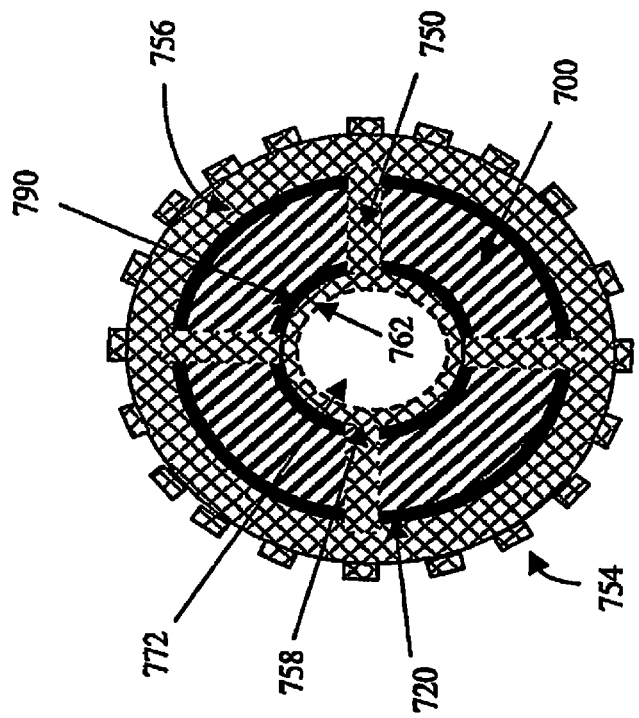
FIG. 7 is a schematic diagram of a cross section along the diameter of a rotatable hollow tube housing base in an embodiment of the present invention with hollow through channels filled with a porous material, the inner surface of the base covered with a porous pad material and the outer surface of the base covered with a porous pad material including protrusions.
Figure 6:
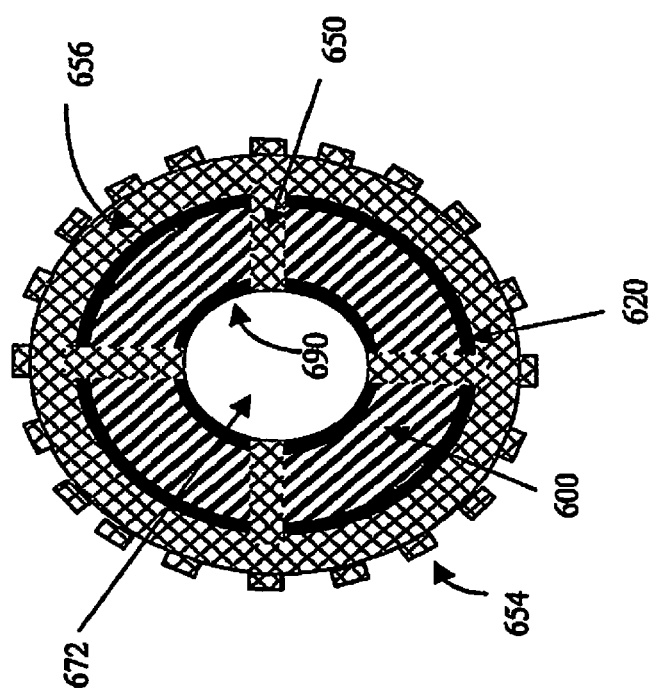
FIG. 6 is a schematic diagram of a cross section along the diameter of a rotatable hollow tube housing base in an embodiment of the present invention with hollow through channels filled with a porous material and outer surface of the base covered with a porous pad material having protrusions.

Various modifications of the present invention may be made as would be know to those skilled in the art. For example, FIG. 6 illustrates a cross section along the diameter of a hollow tube housing base 600 with inner surface 690 and outer surface 620. Through channels 650 are shown filled with and interlocking a porous pad material which also forms porous pad layer 656 with protrusions 654 covering base outer surface 620. The porous material in the channel 650 interlock the porous pad material 656 with the base 600. The porous materials in the through channels and covering the base form a monolithic structure, porous pad material 656 is substantially absent from the inner surface 690 in the core 672 of the device. The core 672 of the device may be connected a rod from the cleaning or material removal tool to accept fluid from the tool and distribute it to the porous pad layer 656 on the surface through channels 650. The base 600 may be connected via a machine drive fitting, not shown, to rotate the base and porous pad material against a substrate. FIG. 7 shows a cross section along the diameter of a hollow tube housing base 700 with inner surface 790 and outer surface 720. Through channels 750 are shown filled with a porous pad material that interlock the base 700 with the pad materials 756 and 758. The porous pad material forms a porous layer 758 covering inner surface 790 of the base and an outer porous pad layer 756 with protrusions 754 covering base outer surface 720. The porous materials in the through channels 750, inside the core 772 and covering the base preferably form a monolithic structure. The core 772 of the device accepts fluid through a fluid fitting connected to the base 700, not shown, from the tool and distributes it to the surface porous pad layer 756 through channels 750. The base 700 may be connected via a machine drive fitting, not shown, to rotate the base and porous pad material against a substrate to be treated.

Figure 8B:
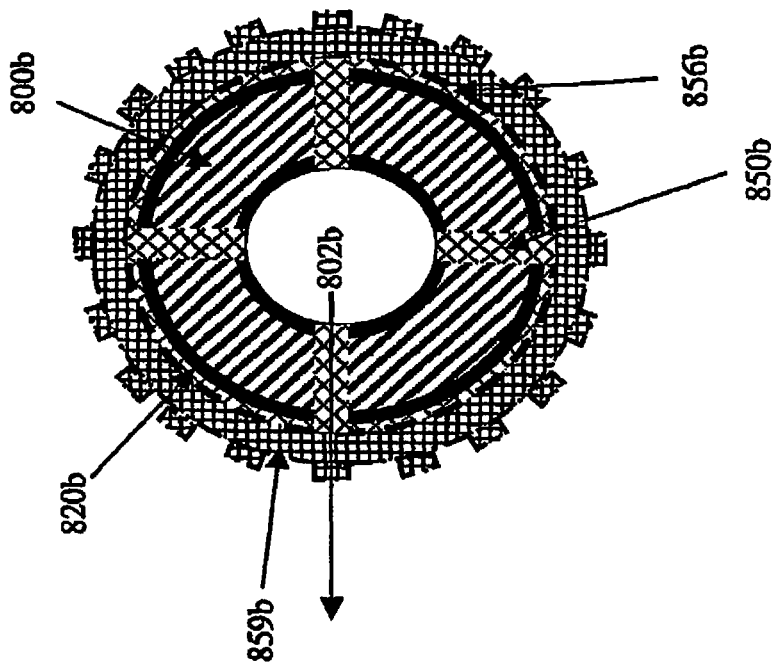
FIG. 8B is a schematic diagram of a cross section along the diameter of a hollow tube housing base in an embodiment of the present invention with a rotatable hollow cylinder with through channels filled with a first porous pad material, the outer surface of the base covered with a first porous pad material and a second porous pad material including protrusions covering the first porous pad material.
Figure 8A:
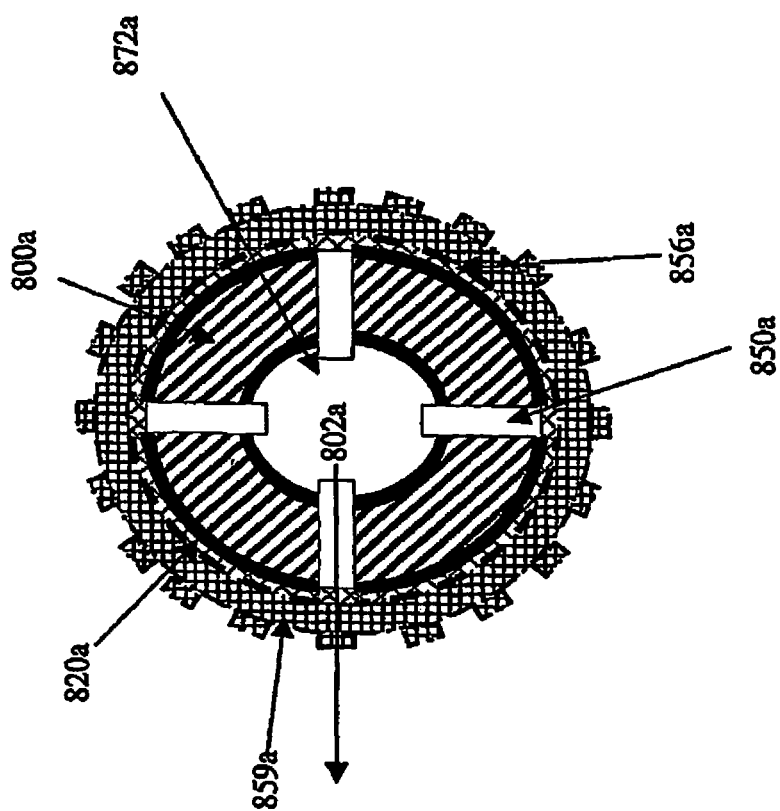
FIG. 8A is a schematic diagram of a rotatable hollow tube housing base in an embodiment of the present invention with an adherent porous pad layer covering the base and a second porous pad material adhering to the first porous pad layer that has been molded or cast onto the adherent first porous layer.

FIG. 8A is a schematic diagram of an embodiment of the present invention having a first adherent porous pad material 856a covering the rotatable substrate 820a having core 872a. The first porous pad material 856a may have a second layer of a porous pad material 859a cast or molded on to at least a portion and preferably all of the first layer of porous pad material 856a. Base 800a has through channels 850a and outer surface 820a covered with an adherent first porous pad material 856a. The porous pad material 856a adhering to the outer surface 820a may be chemically or mechanically bonded to the rotatable substrate 800a with surface 820a by molding a preformed pad of porous pad material to the base 800a. The first porous pad material 856a covering the base 800a may be bonded by casting, solvent bonding, or molding the porous pad to the surface of the rotatable substrate. This first porous pad material can serve as an adhesion layer to hold or interlock the second porous pad layers such as 859a by chemical bonds, or mechanical interlocking bonds, or a combination of these between the first and second pad materials. The adherent porous pad material 856a covering the base 800a, preferably covers the through holes 850a while maintains its porosity after bonding to the base surface 802a. This porosity permits fluid flow from the core 872a through holes 850a and to the outer pad layer 859a as illustrated by 802a. In optional embodiments the porous pad material may fill a portion of one or more of the through channels 850a, not shown, to form an adherent and interlocking monolithic porous pad material 856a covering the base surface 802a. The porous pad material layer 856a covering the outer surface 820a is preferably thinner than the second porous pad layer 859a and may or may not have protrusions. The outer surface of layer 856a may be covered with a second layer of porous pad material 859a, shown with protrusions, by a second molding process or by sliding a second preformed porous pad material or cleaning brush over the layer 856a. The second porous pad material may be a replaceable sleeve or may have a fluid conductance different from porous material layer 856a to better distribute fluid to a substrate to be treated by fluid 802a.

In FIG. 8B a schematic diagram of an embodiment with a an adherent porous layer filling the base through channels is shown. Base 800b has through channels 850b filled and outer surface 820b covered with an interlocking monolithic porous pad material 856b. The porous pad material layer 856b covering the outer surface 820b is thin and does not have protrusions. The outer surface of layer 856b may be covered with a second layer of porous pad material 859b, shown with protrusions, by a second molding or casting process or by sliding a second preformed porous pad material or cleaning brush over the layer 856b. The second porous pad material may be a replaceable sleeve or may have a fluid conductance different from porous material layer 856b to better distribute fluid to a substrate to be treated by fluid 802b. The second porous pad material 859b may have the same or a different composition that first porous pad material 856b.

Figure 9:
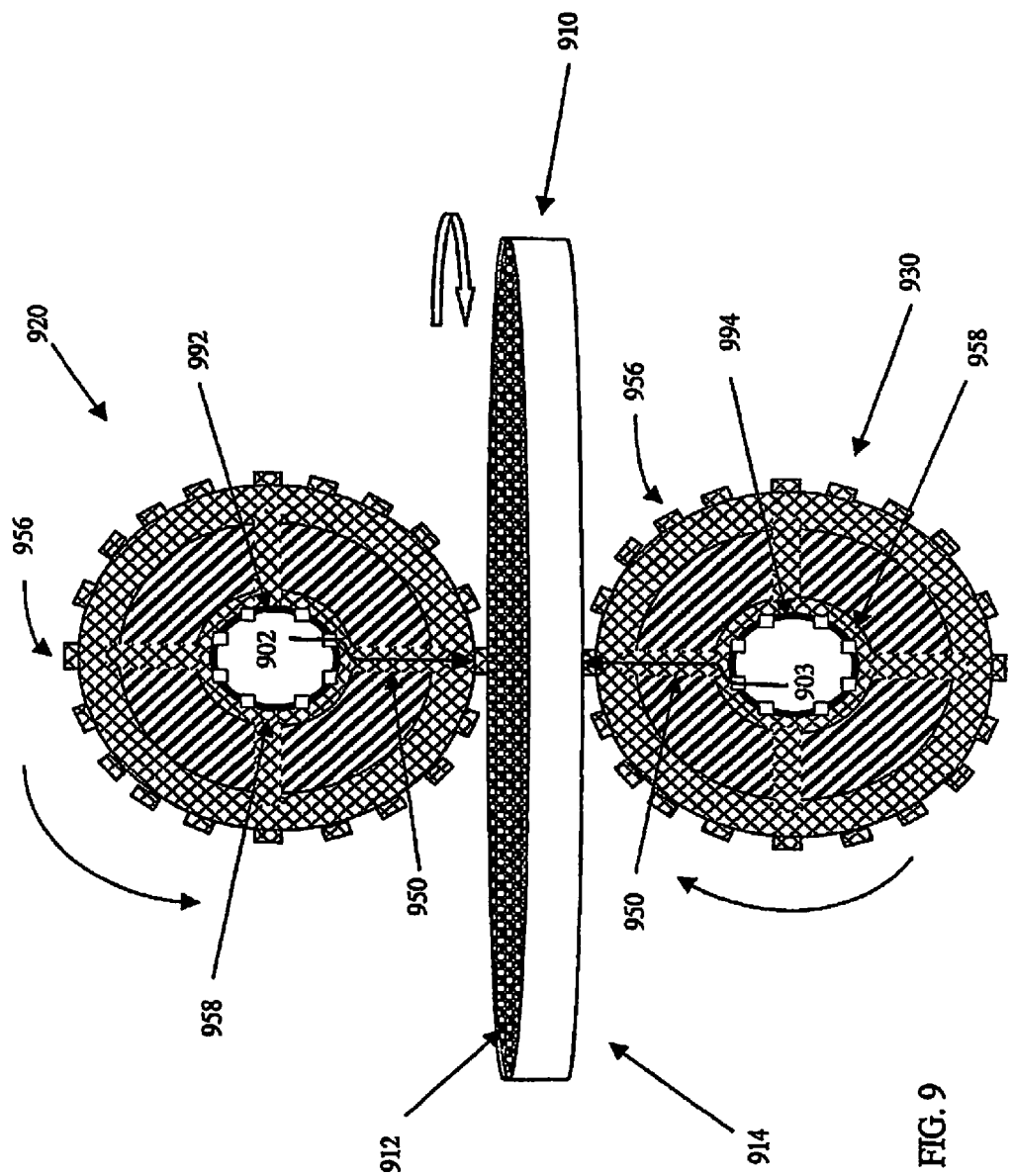
FIG. 9 is a schematic diagram of an embodiment of the present invention cleaning one or more surfaces of a substrate.

The devices of the present invention may be used to remove material from one or more surfaces of a substrate 910 as illustrated in FIG. 9. In this non-limiting diagram, the devices are shown in cross section as a brush roller 920 over the top substrate surface 912 and brush roller 930 below the bottom substrate surface 914. The brush 920, similar to that detailed in FIG. 7, may receive pressurized fluid 902 from a perforated rod 992 or fluid fitting attached to the base which is connected to a fluid conduit from the cleaning tool (not shown). Fluid 902 flows through the porous pad material layer 958 surrounding the perforated rod 992 and through channels 950 filled with the porous pad material. The fluid is illustratively delivered to the substrate through the protrusions in the porous pad layer 956 which also removes particles and material from the substrate as it is rotated. Perforated rod 994 or a fluid fitting attached to the base delivers fluid 903 to the brush 930 which is similar to that depicted in FIG. 7. Fluid 903 flows through the porous pad material layer 958 surrounding the perforated rod 993 and through channels 950 filled with the porous pad material. The fluid is illustratively delivered to the substrate through the protrusions in the porous pad layer 956 which also removes particles and or material from the bottom of the substrate as it is rotated.

Figure 10C:
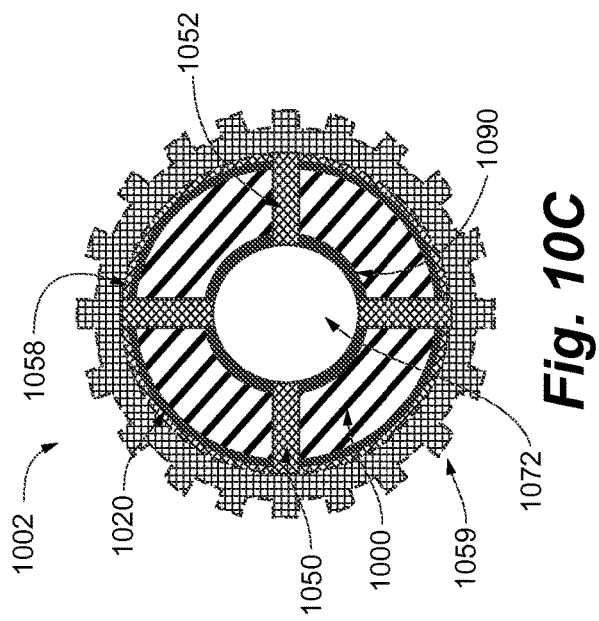
FIG. 10C illustrates a brush formed by combining the components in FIG. 10A and FIG. 10B.
Figure 10A:
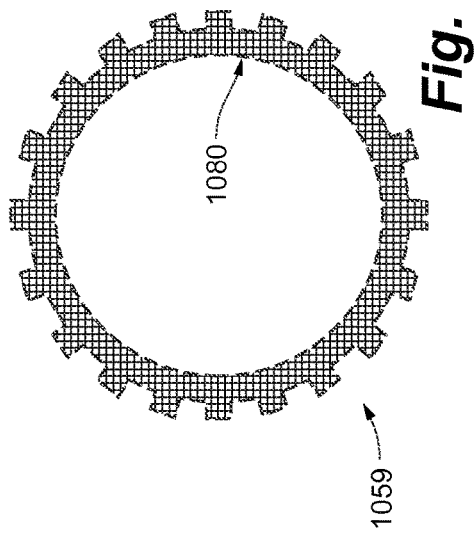
FIG. 10A illustrates a cross section of a brush pad with protrusions.
Figure 10B:
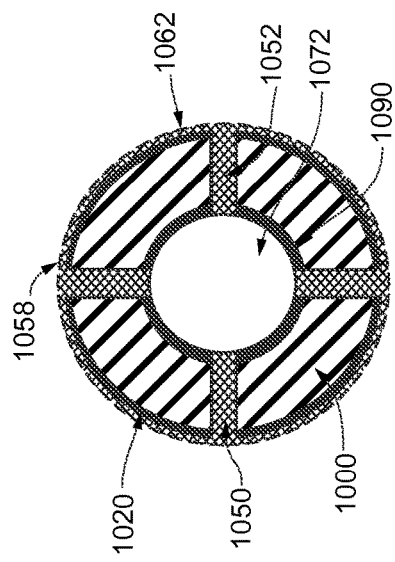
FIG. 10B illustrates a cross section along the diameter of a hollow tube housing base in an embodiment of the present invention with hollow through channels filled with a porous material and the outer surface of the base covered with a first porous pad material.

FIG. 10A illustrates a cross section of a second porous brush pad 1059 with protrusions and having an inner surface 1080. FIG. 10B illustrates a cross section along the diameter of a hollow tube housing base 1000, with core 1072 and hollow through channels 1050 filled with a porous material 1058 in a monolithic structure. Housing base has inner surface 1090 and outer surface 1020. The inner surface 1090 may or may not have a layer of porous pad material. The outer surface 1020 of the base may be covered with a first porous pad material layer 1058 with outer surface 1062. The first porous pad material may be bonded by casting, solvent bonding, or molding of the porous layer 1058 to the base surface 1020 by chemical bonds, mechanical bonds or interlocking, or a combination of these bonds. The inner surface 1080 of second porous brush pad 1059 in FIG. 10A may be cast, molded, or slid over the outer surface 1062 of first porous pad layer 1058 to form a composite brush device 1002 as shown in FIG. 10C. Preferably the second porous brush pad 1059 is cast onto the first porous pad layer 1058 and is chemically bonded, mechanically bonded, or a combination of these bonded to the first porous layer. Optionally the porous pad layer 1058 does not interlock with through channels 1050 (not shown). The first porous pad material and the second porous pad material may be a single layer, preferably they are formed from the same material.

FIG. 11A illustrates a cross section of a second porous brush pad 1159 with protrusions and having inner surface 1180. FIG. 11B illustrates a cross section along the diameter of a hollow tube housing base 1100 including one or more hollow through channels filled with a porous pad material 1152. FIG. 11C illustrates a brush formed by the components in FIG. 11A and FIG. 11B. Device 1102 has porous pad material 1158 filling and interlocking with channels 1150 to form a monolithic structure with base 1110. Second porous brush pad 1159 covers the base 1100 and contacts channels filled with the porous pad material.

One method of retaining the porous pad material on the surface of the housing base is to form recessed channels, posts, or hollows in the surface of the surface of the housing. The recessed holes, posts, or channels preferably have a larger opening at their bottom than at their top. In FIG. 12 the base 1200 has exemplary recessed channels 1232 and 1234. The upper surface portions 1236 and 1238 are part of the base outer surface into which the recessed channel 1234 was cut. Porous base material 1256 cast onto the base 1200 fills at least a portion of the surface recess down to the surface 1220 of the base to interlock the porous pad material with the base 1200. This prevents lifting of the porous pad material 1256 from the base surface during use and aids in maintaining the height and the position of the protrusions or nodes 1254 along the base 1200 surface or rotational axis. The base 1200 may also be connected to a machine drive fitting, not shown. In use as a brush, the embodiment if FIG. 12 may have chemicals or other fluids dispensed on the substrate to be treated by external sprayers as would be known to those skilled in the art. Channels similar to 1234 and 1232 may be formed in bases having through holes and porous pad material fluidly connecting the inner and outer surfaces of the base.

Figure 13:
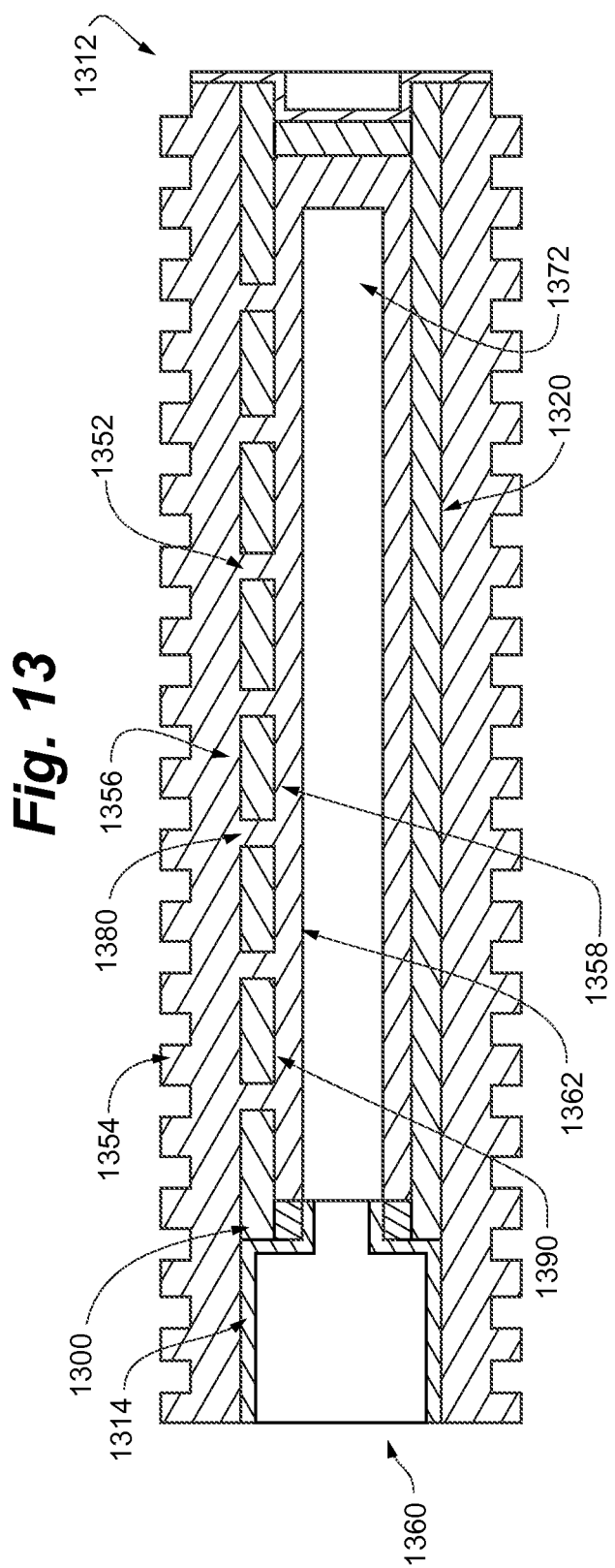
FIG. 13 shows a line drawing of a photograph of cross section of a brush molded onto a rotatable base using methods and materials of the present invention.

FIG. 13 is a line drawing of a photograph of a cross section of a brush molded onto a rotatable base of the present invention. FIG. 13 shows a cross section along the length of a hollow cylindrical housing base 1300 with exemplary through channels 1380 as well as the inner surface 1390 and outer surface 1320 of the base filled or covered with the porous pad material. Through channels illustrated by 1380 are shown filled with a porous material 1352 in a mold which also forms layers 1356 and 1358 of the porous pad material on base surfaces 1320 and 1390. The porous pad material interlocks with the through channels 1380 of the base 1300. Node protrusions 1354 are shown covering the porous layer 1356. The materials 1352, 1354, 1356, and 1358 are all the same and form a continuous monolithic structure. The porous base material filling the exemplary channels 1352 interlocks 1365 and 1358 and acts to prevent lifting of the porous pad material 1356 and 1354 from the base surface during use especially at high rotation rates. Interlocking also aids in maintaining the height and the position of the protrusions or nodes 1354 along the base surface or its axis and provides more uniform contact of the nodes 1354 with a substrate surface. Fluid fitting 1314 and cleaning machine tool endcap 1312 are shown connected to the base 1300. Porous pad material layer 1358 inside the base has a thickness measured between pad inner surface 1362 and base inner base surface 1390. The thickness of the porous pad layers 1354, 1356, and 1358 may be varied by changing the shape and dimensions of the mold. In use as a cylindrical brush, a source of pressurized fluid would be connected to fluid inlet fitting 1314. Fluid would flow into the device through inlet 1360 of a fluid fitting and into the core 1372 defined by the inner surface 1390 of base 1300. Fluid would flow through porous pad layer 1358, out of the flow channels such as 1350 filled with the porous material 1352 and then distributed out to the porous pad layer 1356 and nodes 1354.

Figure 14:
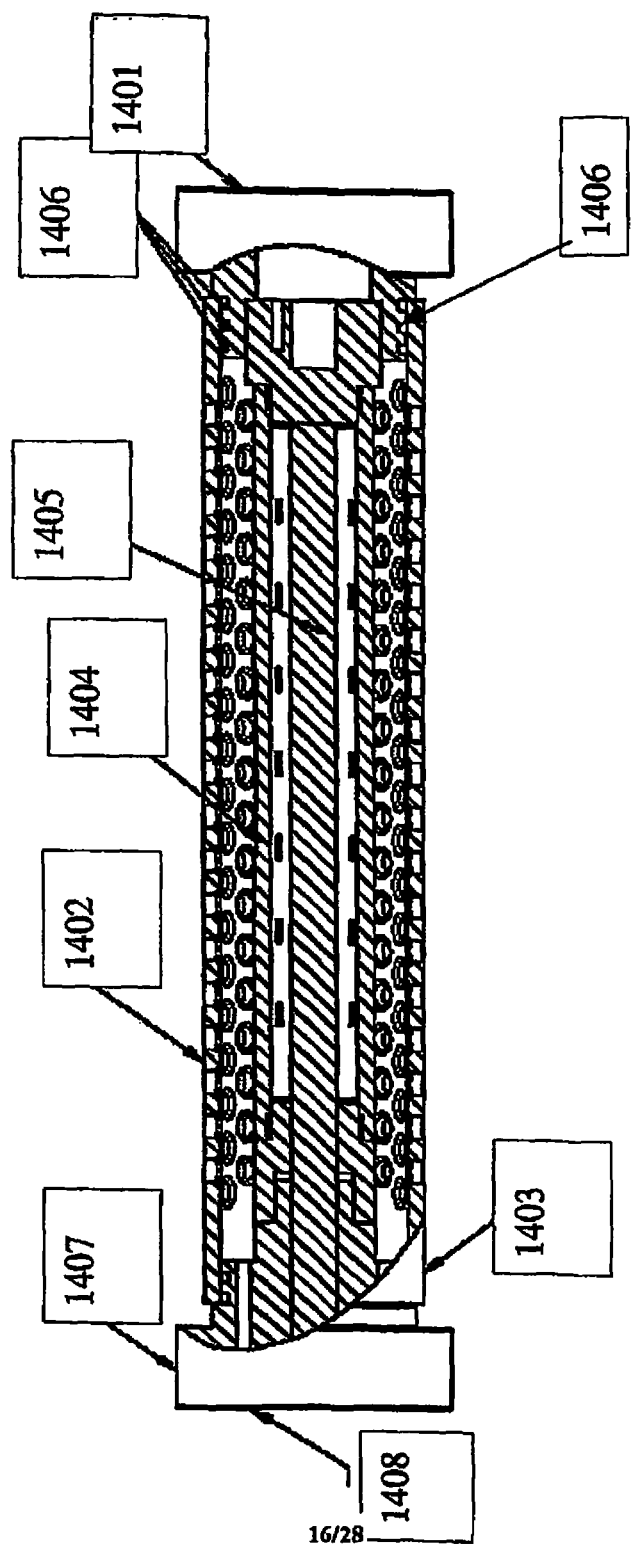
FIG. 14 is a diagram of a mold that can be used to make a brush molded onto a rotatable base of the present invention.

FIG. 14 illustrates a mold which may be used to make a brush molded onto a rotatable base of the present invention. The mold includes and end cap 1401 with o-rings 1406 sealing the endcap 1401 to the mold sleeve 1402. Mold sleeve 1402 is used to create protrusions or recesses in the porous pad and may be surrounded by a shrink wrap film 1403 to retain un-polymerized porous pad monomer and catalyst filling the mold sleeve 1402 and in the core assembly 1404 shown with through channels. A top filler cap 1407 is used to seal the top of the mold sleeve and retain mold core 1405 within the center of the core. Barbed fluid fittings 1408 are provided to the top filler cap 1407.

Figure 15:
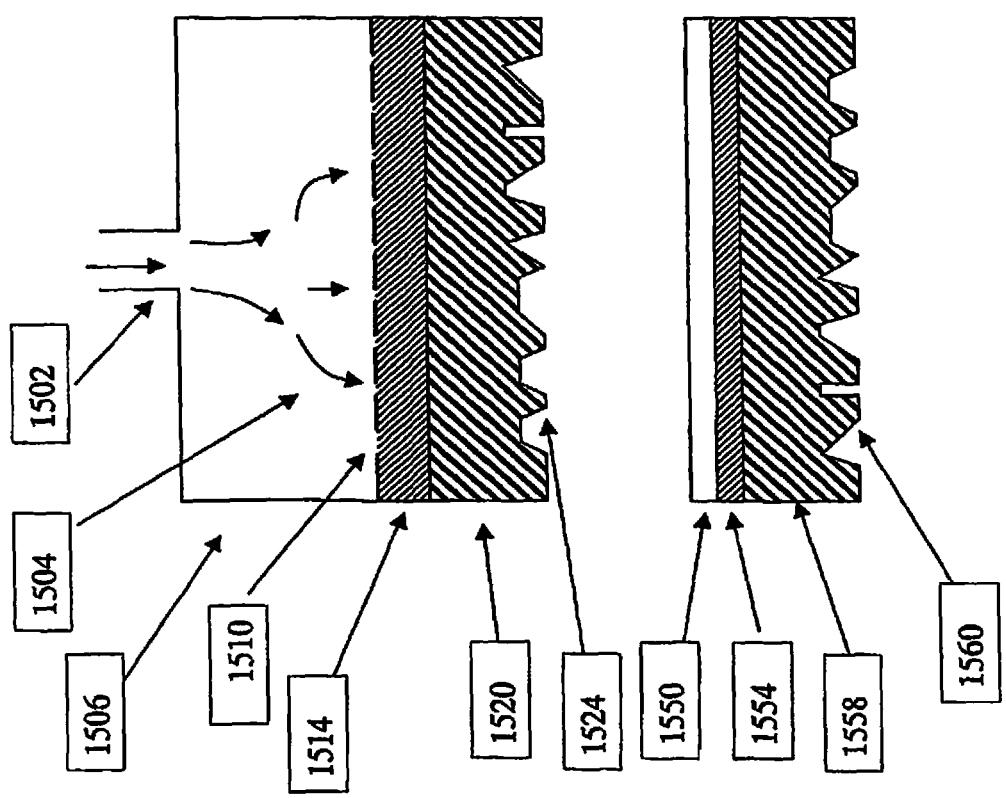
FIG. 15A is a non limiting illustration of an embodiment of the present invention having a porous pad material cast onto an adherent first porous material on a rotatable substrate having through holes.
FIG. 15B is a non-limiting illustration of an embodiment of the present invention of a porous pad material cast onto an adherent first porous material on a rotatable nonporous substrate.

FIG. 15A illustrates an embodiment of the present invention where a cast or molded porous pad layer 1520 having optional protrusions 1524 is interlocked to a rotatable base 1505 through a porous adhesion layer 1514. The rotatable base may have a plurality of channels 1510 for the flow of a fluid 1504 from fluid inlet and rotating shaft 1502 coupled to the base 1506. The fluid 1504 may flow through porous adhesion layer 1514, and through the porous pad 1520 having optional protrusions. FIG. 15B illustrates an embodiment of the present invention where a cast or molded porous pad 1558 having optional protrusion 1560 is interlocked with a nonporous substrate 1550 through a porous adhesion layer 1554. The non porous substrate may be coupled to a rotating vacuum chuck from a cleaning or polishing tool.

Figure 16:
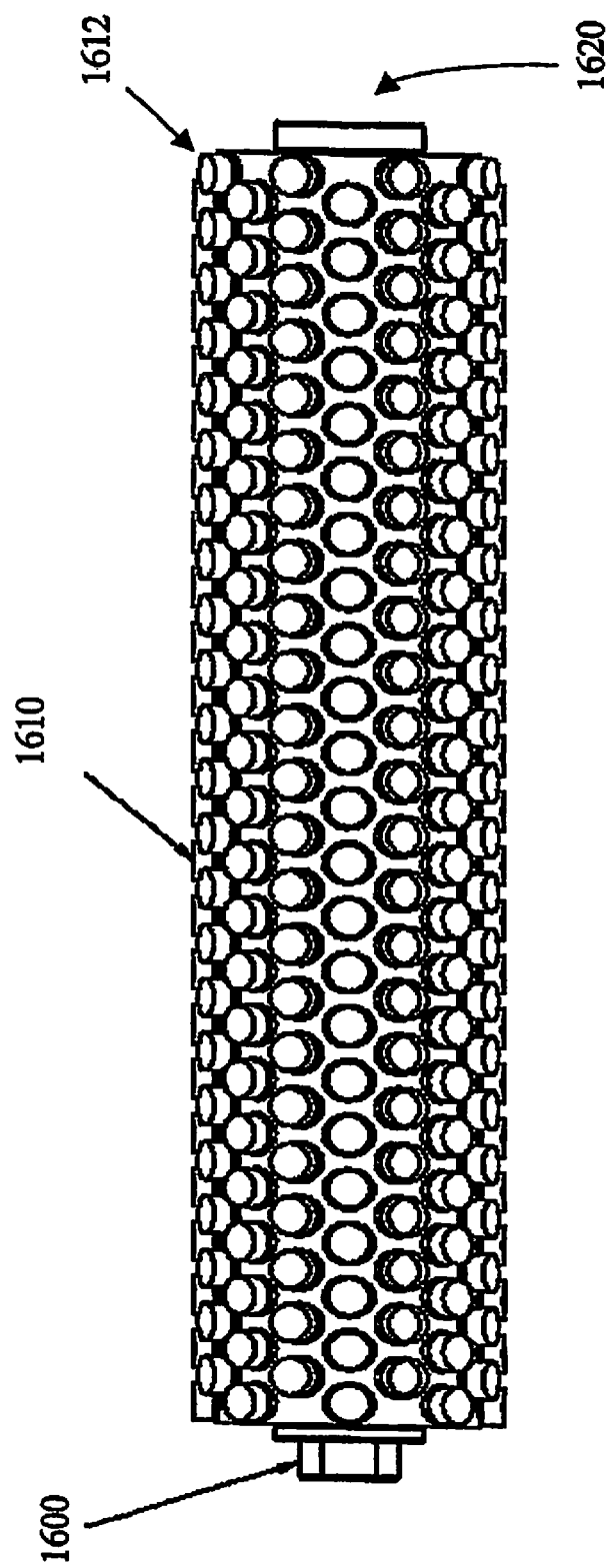
FIG. 16 is an illustration of a material removal pad of the present invention including a porous pad molded into channels of a rotatable core and having interchangeable fluid and tool drive mounting fitting on the core.

FIG. 16 is an illustration of a material removal pad of the present invention including a porous pad 1610 with surface protrusions 1612 molded. The porous pad 1610 is molded into channels of a rotatable core and having interchangeable fluid inlet fitting 1620 and tool drive mounting fitting 1600 attached to the core for connection to a rotatable shaft or fixture on a tool for rotating the device.

Figure 17:
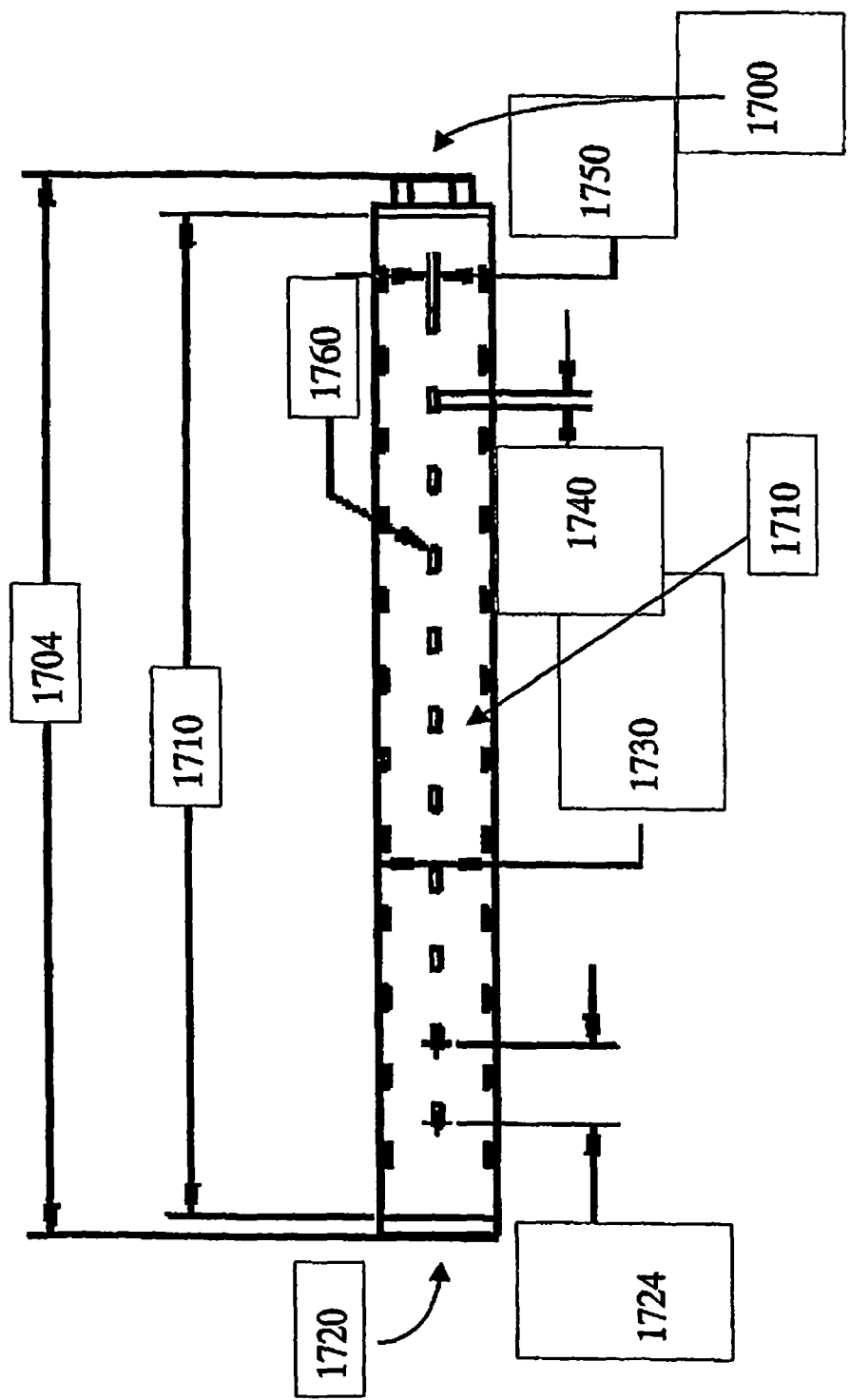
FIG. 17 is an illustration of a rotatable base core of the present invention having interchangeable fluid and mounting fitting on the core.

FIG. 17 is an illustration of the core 1710 of diameter 1730 having interchangeable fluid fitting 1720 attached to the core and tool drive mounting fitting 1700 attached to the core for connection to a rotatable shaft or fixture on a tool for rotating the device. The core is shown with channels 1760 through the core or base 1710. The channels would be filled with the porous pad material from casting to interlock the pad material with the base 1710. The length of the channels 1740, their spacing from each other 1724 and their height 1750 may be varied depending upon the desired flow rate and distribution of fluid through the porous pad material in the channels.

Figure 18:
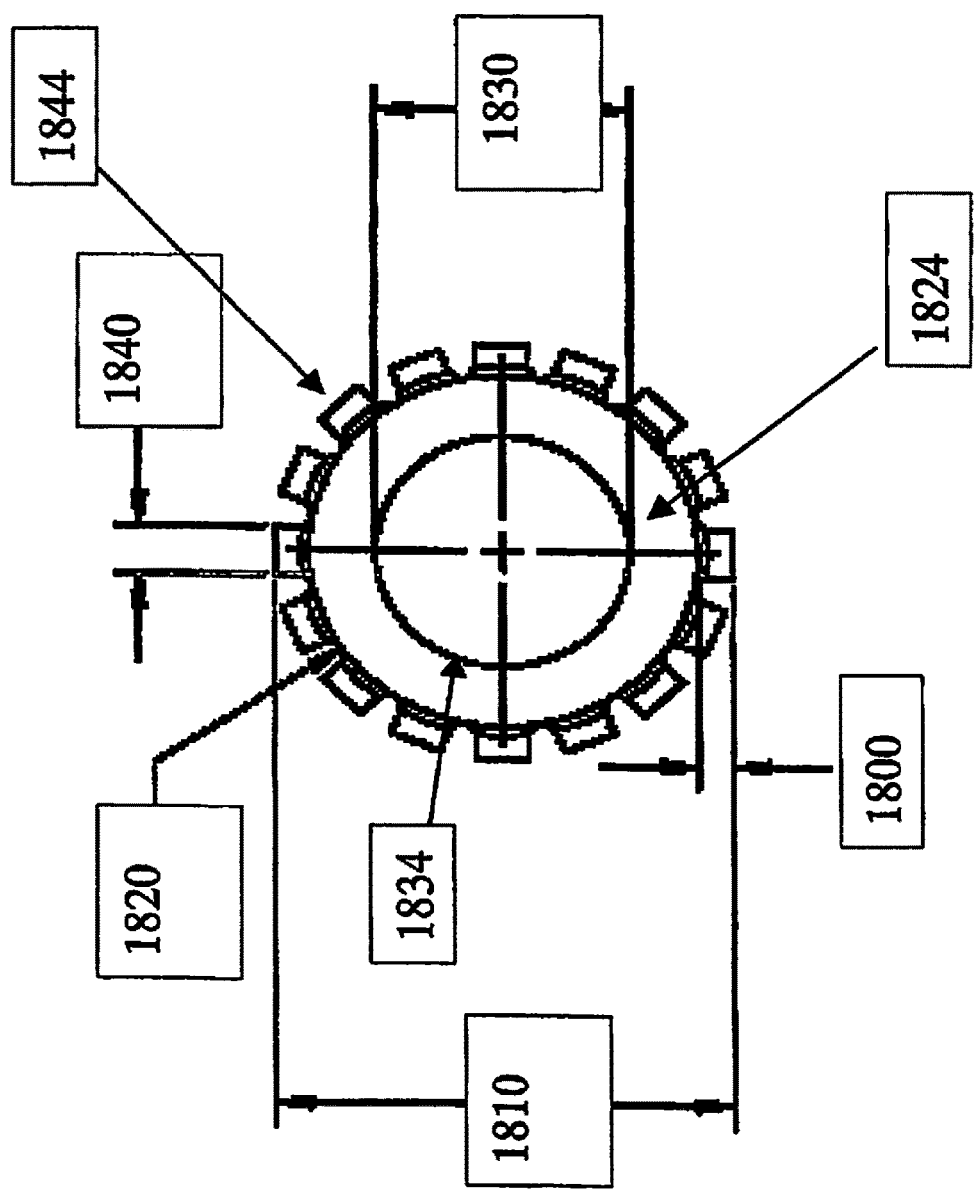
FIG. 18 is an illustration of a cross section of a material removal pad of the present invention including a porous pad molded into channels of a rotatable core.

FIG. 18 is an illustration of a cross section of a material removal pad of the present invention including a porous pad 1824 molded into channels, not shown, of a rotatable core 1834 having outside diameter 1830. The protrusions 1844 on the porous pad have a diameter 1840 and a height 1800 from a surface of the pad 1820. The outside diameter of the pad 1810 is measured from the outside of the protrusions 1844.

FIG. 19A is an illustration of an unassembled bare base core 1920 including channels 1924 with interchangeable fluid fitting 1910 and tool drive mounting fitting 1930. The channels 1924 are preferably filled with a porous pad material to interlock it with the base 1920. FIG. 19B is an illustration of the fluid fitting and tool mounting fitting inserted into the inside of the core and having a final assembled length of 1940. Although shown with the fittings 1910 and 1930 being inserted into the inside of the core, similar fittings in this embodiment or other embodiments of the present invention could be adapted by those skilled in the art for mounting onto the outer surface of the core. FIG. 19C is a Detail A in FIG. 19B and shows the joint formed between the core 1920 and the fluid fitting 1910. The fluid and machine drive fittings may be attached, mated, or fixed to the core by methods including but not limited to a solvent bond, an ultrasonic weld, radiant heating, or by machined threads on outside surface 1950 of the fittings and the inside surface 1960 of the core.

Figure 19:
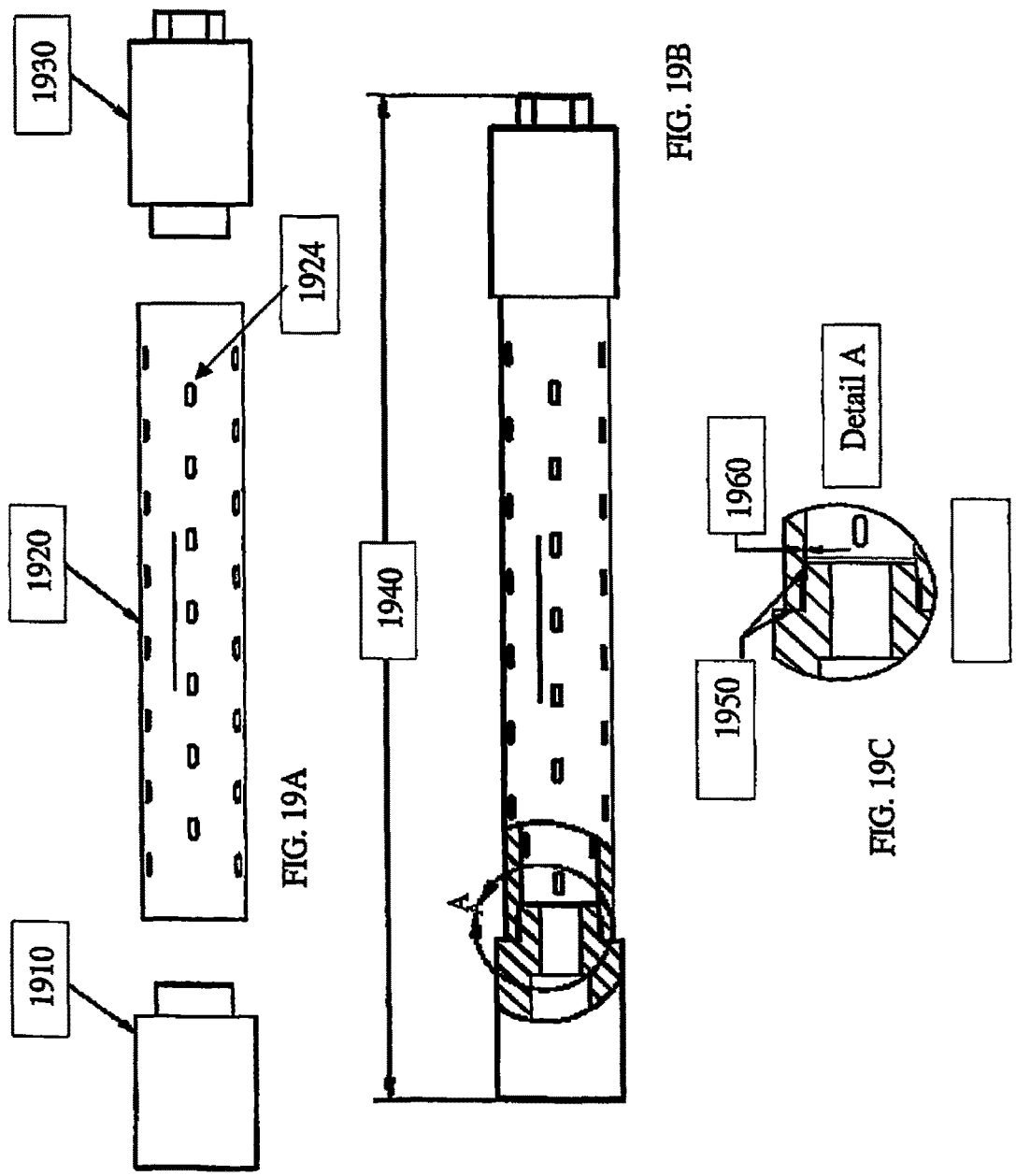
FIG. 19A is an illustration of an unassembled rotatable base core with interchangeable fluid and tool mounting fitting.
FIG. 19B is an illustration of the fluid fitting and tool mounting fitting inserted into the base core.
FIG. 19C is a detail (A) of the joint formed between the base core and the fluid fitting.
Figure 20:
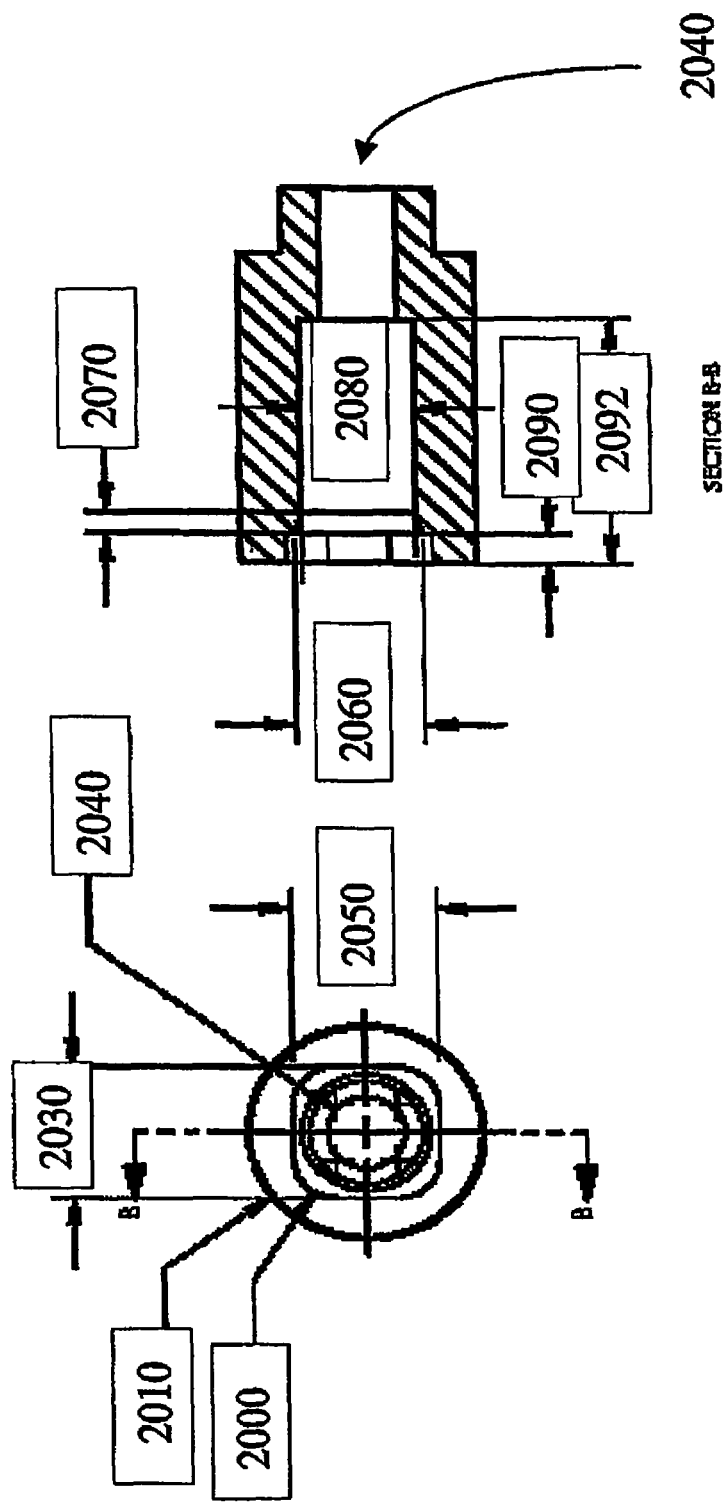
FIG. 20 is an illustration of a fluid fitting 1910 of FIG. 19A in detail.

FIG. 20 is an illustration of a fluid fitting 1910 of FIG. 19A in detail. The fitting 2010 has a conduit 2040 which extend through the piece for fluid flow into the core 1920 of FIG. 19 from a material removal tool. The inner diameter 2080 may be used for accepting a fluid conduit from the tool. The fitting 2010 may have an o-ring or compression fitting, not shown, for retaining the fluid conduit with the fitting 2010. The size and configuration of the openings 2060, 2080, and 2040 may be varied and is not limited by the present description as would be known to those skilled in the art of making fluid fittings. One advantage of the present invention is that the porous pad cast onto the core may be fit with a wide variety of fittings 2010 to adapt the core to a variety of fluid sources, conduits, and or retaining mechanisms used with any polishing, scrubbing, or cleaning machine.

Figure 21:
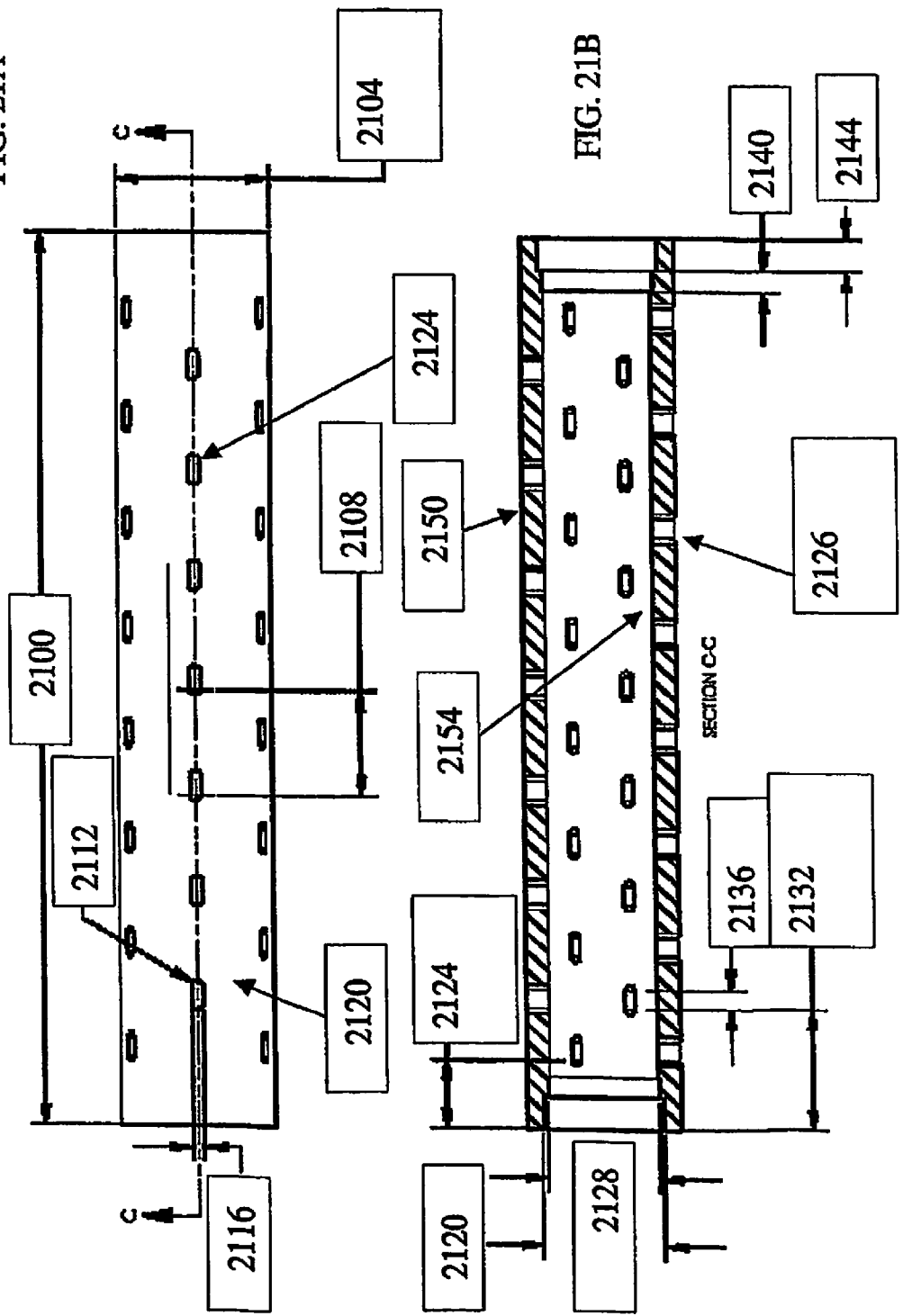
FIG. 21A is an illustration of the outside of a core (1920) of the FIG. 19A.
FIG. 21B is a view of a cross section of the core (1920) of FIG. 19A.

FIG. 21A is a detailed illustration of the outside of the core 1920 of the FIG. 19A. In FIG. 21A the core or base housing 2120 includes a number of slit or oval shaped channels 2124 through the core that are separated 2108 from each other along the housing 2120. The slits would be filled with the porous pad material. The width 2116 of the slits may as well as their separation 2108 may be varied without limitation. FIG. 21B is a view of a cross section of the core 2120 whose diameter 2104 may be varied depending upon the application and requirements of the tool. The view shows base 2120 inner surface 2154 and outer surface 2150, the porous pad material may contact both the outer and inner surfaces. The length 2136 of the slits may also be varied to permit greater fluid flow through the channels after being filled with a porous pad material. One of the slits at the bottom of the core is shown in cross section 2126 and is preferably filled with a porous pad material in a finished device to interlock the porous pad to the base 2120. The inside surface of the core may be machined or molded to include one or more steps or stop for the fluid and tool fittings. The inner diameters of two step 2120 and 2128 are shown for illustrative purposes only. The depths 2144 and 2140 of the steps are also shown for illustrative purposes only.

Figure 22:
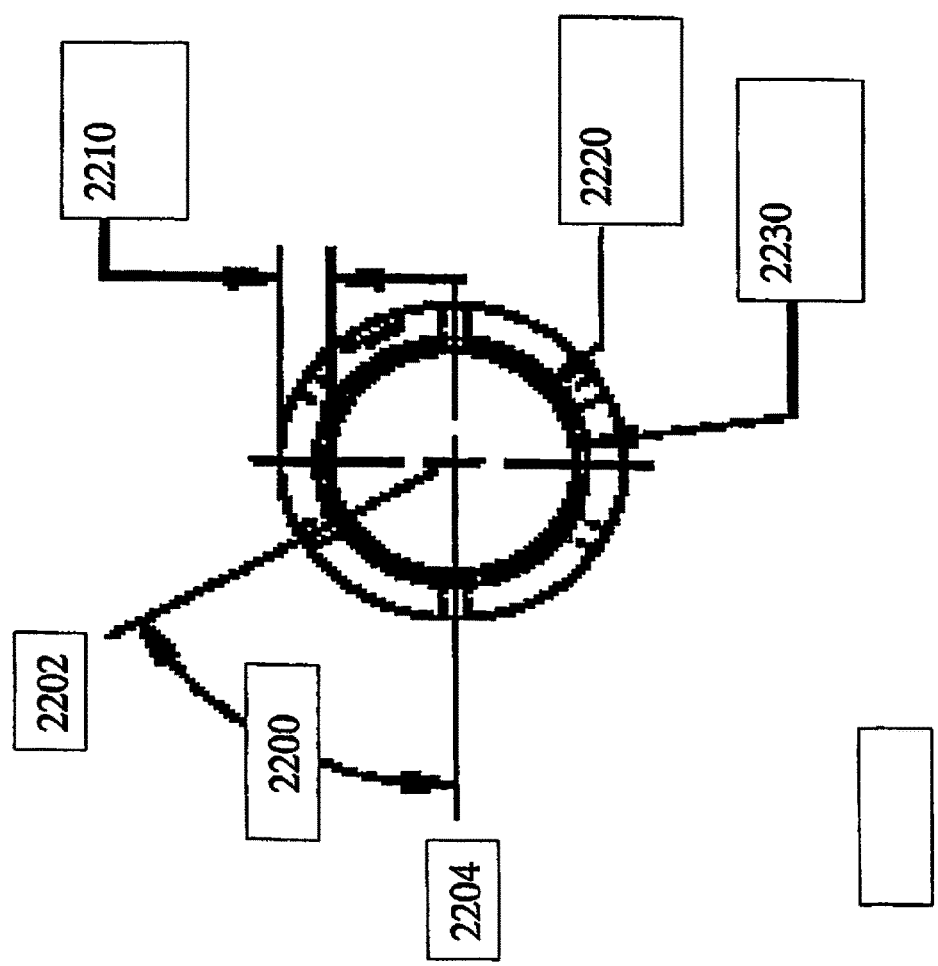
FIG. 22 is a cross section of core in FIG. 19A along a rotational axis of the core illustrating placement of channels and through holes in the rotatable core.

FIG. 22 is a cross section of core in FIG. 19A illustrating placement of channels 2202 and 2204 for interlocking with a porous pad material through the core relative to one another by an angle 2200 which may be varied. The wall thickness 2110 of the core may be varied depending upon considerations such as but not limited to the strength of the core material, the desired volume of fluid held by the core, and the fluid pressure drop across the slit. Steps 2120 and 2130 on the inside of the core may also be varied in their diameter by choice of wall thickness 2110 of the core.

Figure 23:
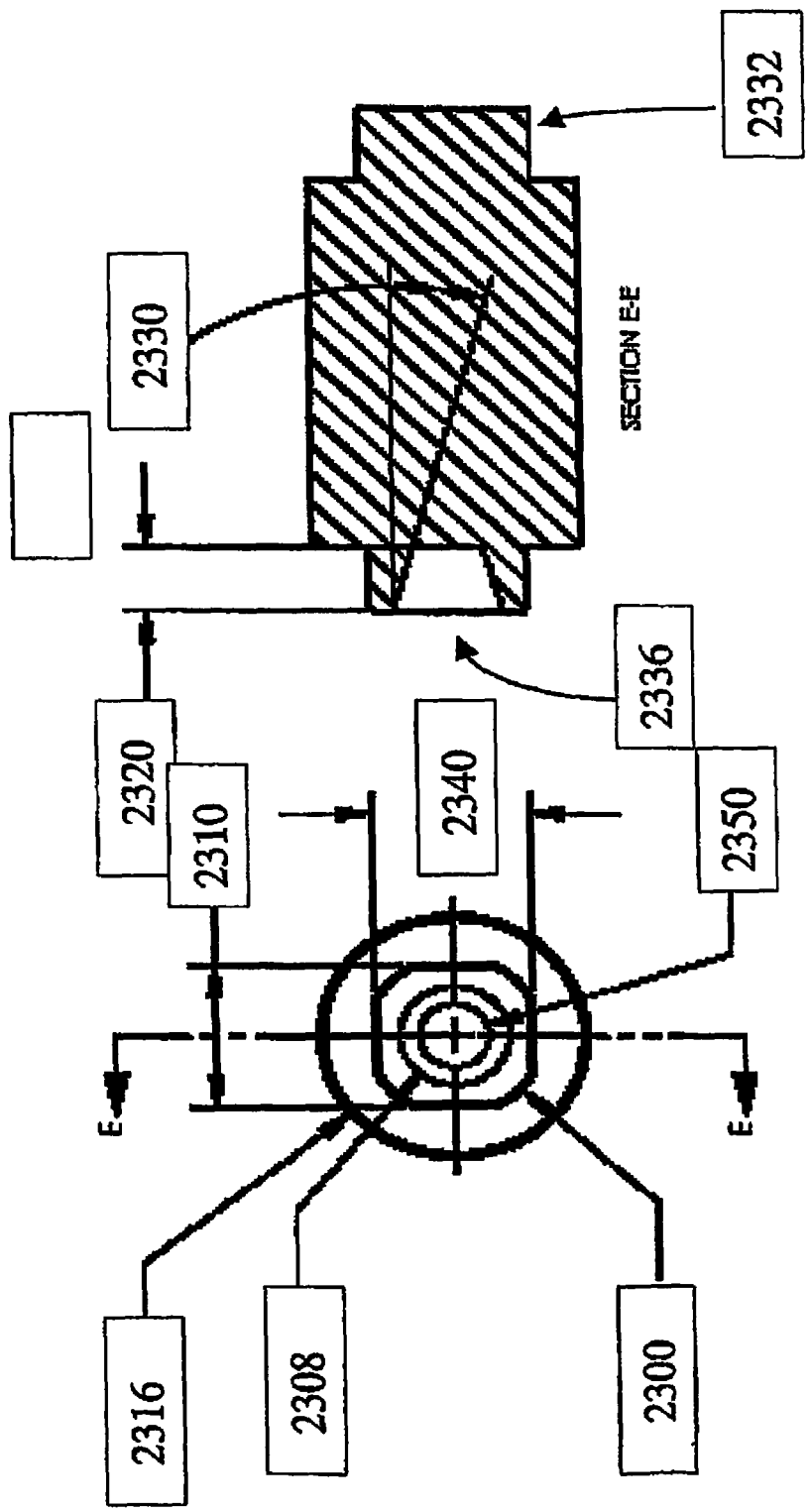
FIG. 23 is an illustration of a tool mounting fitting (1930) of FIG. 19A.

FIG. 23 is an illustration of a tool drive mounting fitting 1930 of FIG. 19A. The tool mounting fitting 2316 has a keyed opening 2336 with a recess 2320 and optional sidewall taper 2330 defined by and angle which mates to a rotating element of a tool. The element, not shown, connects to the fitting 2316 which has been bonded or secured to the core and rotates the core and porous pad. The size and configuration of the keyed opening 2336 may be varied and is not limited by the present description as would be known to those skilled in the art of making. One advantage of the present invention is that the porous pad cast onto the core may be fit with a wide variety of fittings 2316 to adapt the core to any substrate coating machine's rotating fixture or spindle or to any polishing, scrubbing, or cleaning machine's rotating fixture or spindle.

Both the fluid fittings and the tool mounting fittings of the present invention may be configured for a zero clearance fitting by mating opposing surfaces with a gasket or o-ring.

Figure 24:
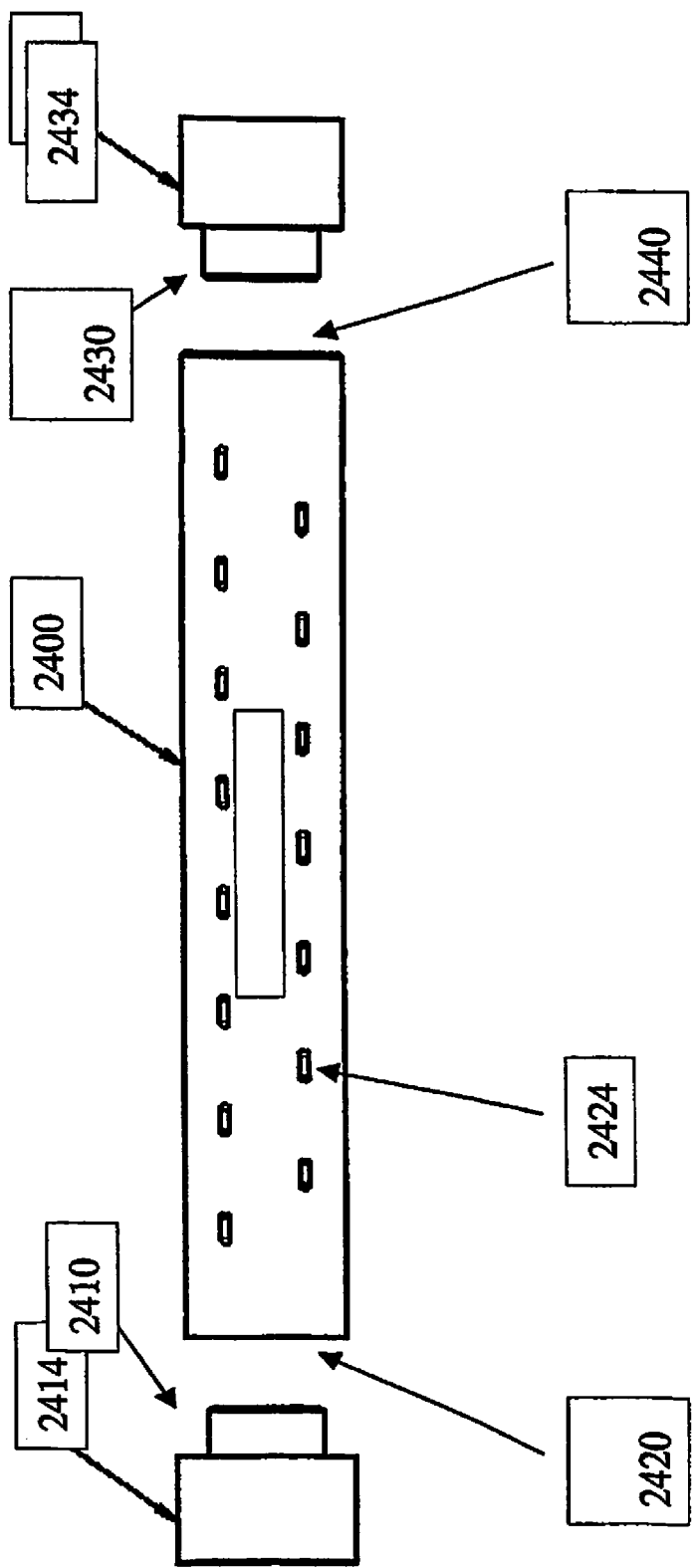
FIG. 24 is a illustration of another embodiment of an unassembled core with interchangeable fluid and tool mounting fittings.

FIG. 24 is a view of another example of an unassembled core 2400 for supporting a porous pad, not shown, that is molded to interlock the pad with channels 2424 through the core. The channels may be filled with a porous pad material for interlocking the pad material with the base 2400. The core has an end 2420 into which the reduced end 2410 of the interchangeable fluid receiving fitting 2414 is inserted and end 2440 into which the reduced end 2430 of tool drive mounting fitting 2434 is inserted. The fluid fitting 2414 and machine drive fitting 2434 may be attached, mated, or fixed to the core 2400 by methods including but not limited to a solvent bond, an ultrasonic weld, radiant bonding, or by machined threads on outside surface of the fittings and the inside surface of the core.

Figure 25:
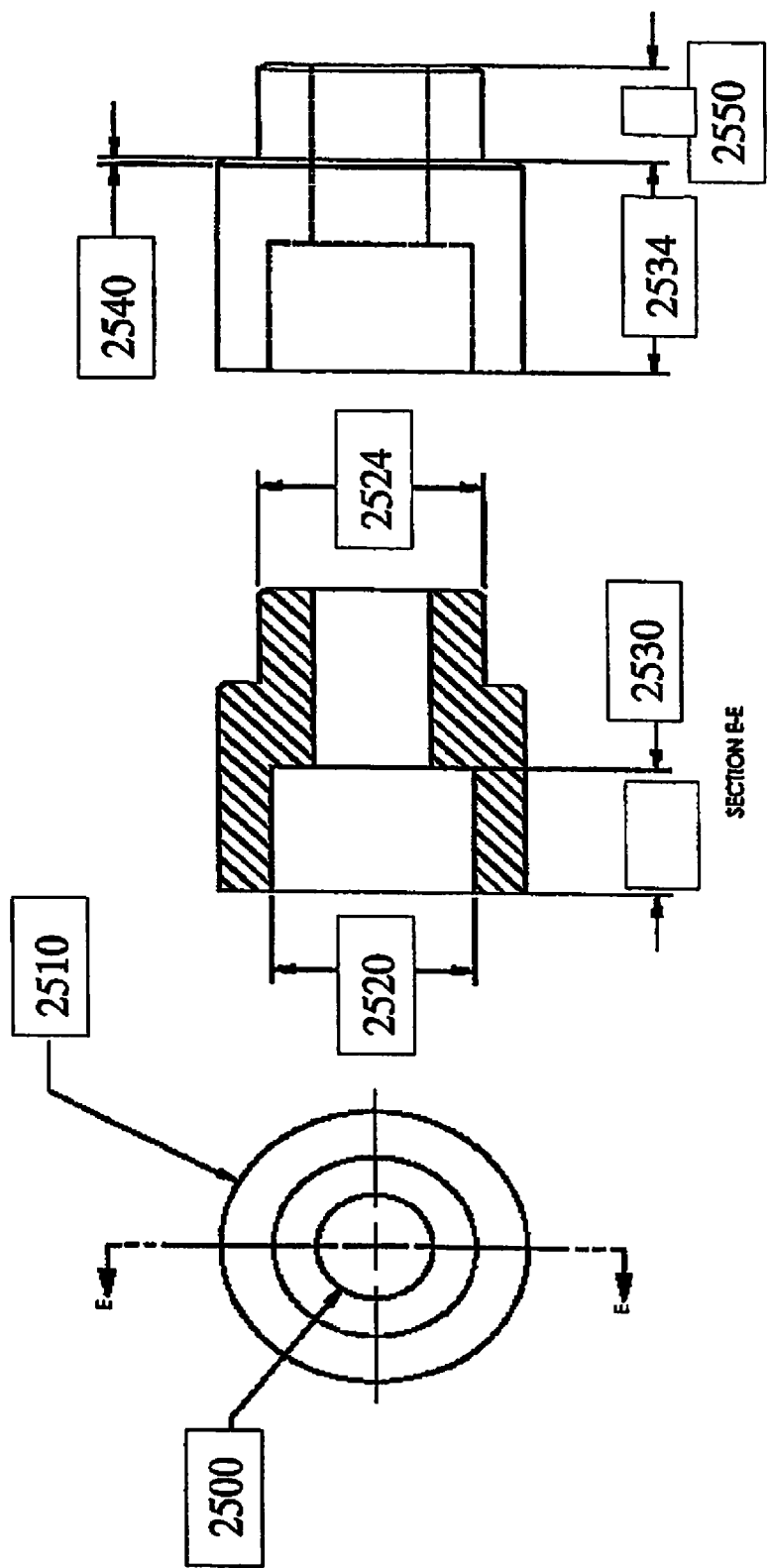
FIG. 25 is a detailed illustration the fluid fitting of FIG. 24.

FIG. 25 is a detailed illustration the fluid fitting 2414 of FIG. 24. Fluid fitting 2510 has a conduit 2500 which extend through the piece 2510 for fluid flow into the core 2400 of FIG. 24 from a source of fluid from the material removal tool. The inner diameter 2520 may be used for accepting a fluid conduit from the tool. The fitting 2510 may also have for example but not limited to an o-ring or compression fitting, not shown, for retaining the fluid conduit with the fitting 2510. The size and configuration of the openings 2500 and 2520 may be varied and is not limited by the present description as would be known to those skilled in the art of making fluid fittings. One advantage of the present invention is that the porous pad cast onto the core 2400 of FIG. 24 may be fit with a wide variety of fittings 2410 to adapt the core to a fluid source, conduit, and or retaining mechanism used with any polishing, scrubbing, or cleaning machine. The fluid fitting has a tapered end 2414 whose diameter 2524 allows it to be inserted and bonded to the core 2400. The size 2534 for the top of the fitting 2510 and the tapered end size 2550 may be varied with the length and height requirement of any tool to which the assembled device is designed for.

Figure 26:
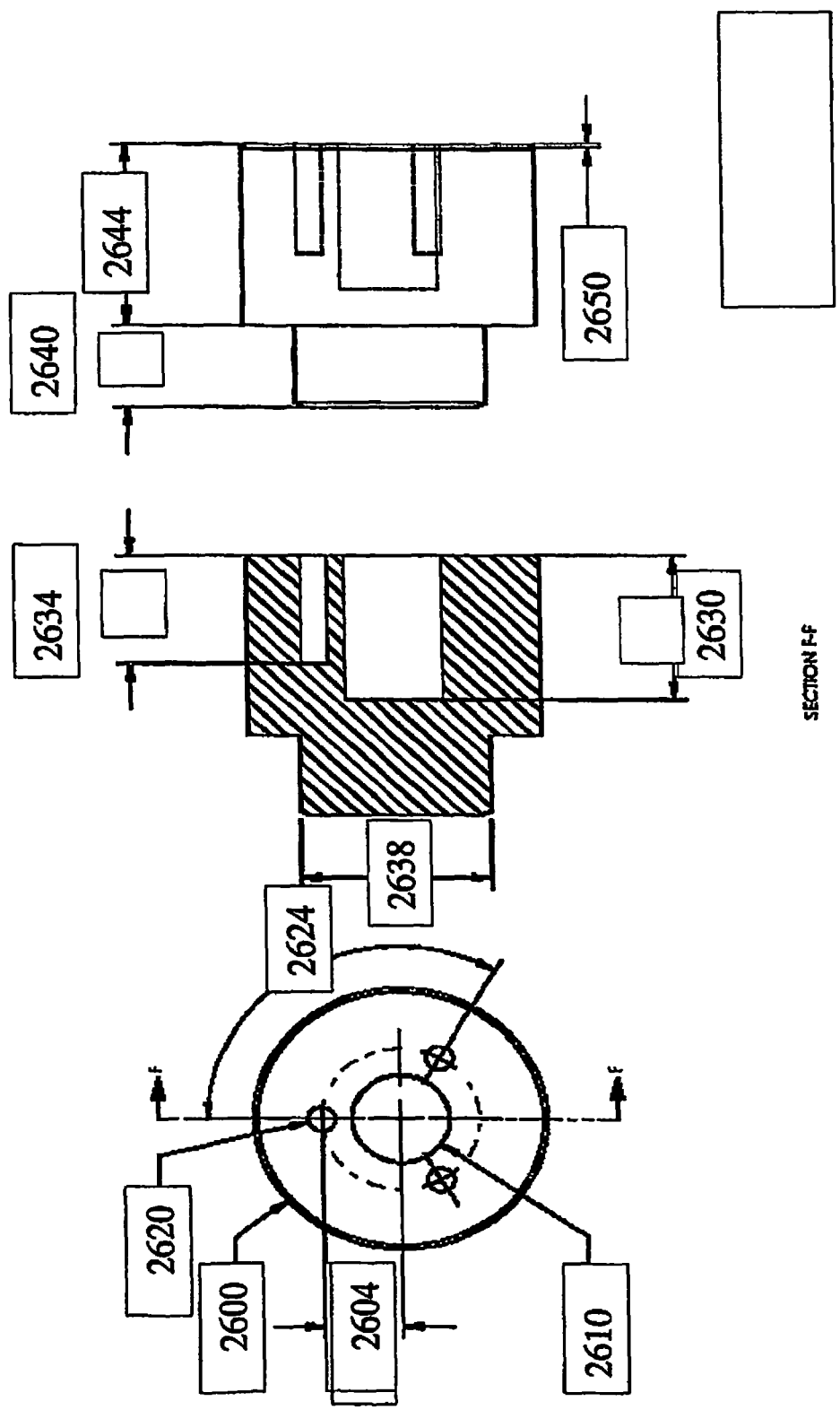
FIG. 26 is a detail illustration of the tool mounting fitting of FIG. 24.

FIG. 26 is a detail illustration of the tool mounting fitting 2434 of FIG. 24. The tool drive mounting fitting 2600 has one or more keyed openings 2620 with a recess depth 2634 and opening 2610 with recess depth 2630 for mating to a rotating element or fixture of a tool. The keyed openings may be placed at an angle 2624 around the drive mount fitting 2600 and offset from center 2604. The rotating element of the tool, not shown, connects to the fitting 2600 which has been bonded or secured to the core and rotates the core and porous pad. The fitting 2600 is inserted into to the inside of the core at its end with diameter 2638 and secured, by bonding, threaded seal or other sealing technique, to the inside of the base 2400. The reduced diameter portion 2638 of the fitting with length 2640. These dimensions may be varied depending upon the overall size requirements for the tool and the pad as well as the strength of the seal required. The size and configuration of the keyed openings 2620 and 2610 may be varied and is not limited by the present description as would be known to those skilled in the art of making. One advantage of the present invention is that the porous pad cast onto the core may be fit with a wide variety of fittings 2600 to adapt the core to any coating, polishing, scrubbing, or cleaning machine's rotating fixture.

Embodiments of the present invention may be used as a brush in an automated wafer cleaning station to clean wafer substrates. In some embodiments brushes from a single sized rotatable base can be for used in a number of different automated wafer cleaning stations to clean wafer substrates by interchange of fittings on the ends of the base. The cleaning station may be controlled in an automated way by a cleaning controller station. Other substrates such as but not limited to wafers, flat panel displays, optical devices, and hard disks could be cleaned or polished using similar station with modifications in substrate handling equipment and chemicals as would be known to those skilled in the art without undue experimentation. The wafer cleaning station may include a sender station, a cleaning stage, a spin-rinse and dry (SRD) station, and a receiver station. In a cleaning process, semiconductor wafers may initially be placed into the sender station. The sender station then delivers a wafer (one-at-a-time) to the cleaning stage. The cleaning stage may be divided into a first cleaning stage and a second cleaning stage, although having just one cleaning stage will also work. After passing through the cleaning stage, the wafer is passed through an exit spray in order to remove the cleaning fluids and any contaminants. The SRD station dries the wafer and then it may be delivered to the receiver station for temporary storage.

A brush mounting system includes a rigid brush core or mandrel on which a brush is mounted. The mandrel in turn, is mounted between brush mounting assemblies. One brush mounting assembly may be a conventional, motor-driven brush mounting assembly having a cylindrical spindle or other rotating fixture. The brush mounting assembly can be mounted to a wall of a wafer scrubbing device via a mounting member such as mounting plate. A bearing may be secured to the mounting plate and the spindle is rotatably mounted on the bearing. The portion of the other mounting assembly which can be connected to the rigid core has rotary motion transmitted to it by the rigid core and to supply cleaning liquid to the brush through the mounting assembly that is not motor driven.

Both the sender station and the receiving station are preferably adapted to receive a cassette containing a number of wafers. The first and second cleaning stages preferably include a set of PVA brushes of the present invention that are very soft and porous. These brushes are mounted brushes to the tool and are located horizontally from one another. The brushes include a base or brush core covered with a monolithic porous pad material that interlocks the porous pad material with the core. The brushes may be mounted to first ends of shafts for rotating the brushes. Rotary unions are mounted to second ends of these rotating shafts. The rotating shafts have central cavities formed therein which allow liquid to flow from the rotary unions through the shafts and into the inside of the brush base. The shafts have perforations in the regions where the brushes are mounted which allows liquid to be distributed from shafts to the inner surface of the brush base or core, through the porous pad material filling the through channels of the core and out to the surface of the brush.

A single brush may be used for material removal or cleaning of a single substrate surface. Alternatively, a pair of brushes may be used for scrubbing a top surface and a bottom surface, respectively, of a wafer or other substrate. Typically, the wafer is caused to rotate in a particular direction while the brushes rotate around an axis of rotation while the surface of the brushes are in contact with the surfaces of the wafer as illustrated in FIG. 9. The brushes are mounted on brush cores or a base material. The brush cores are configured to have at one end, a fluid inlet which connects to tubing or fluid conduit from the tool. The tubing will thus supply the desired fluids to the core within the brush base. The brush core with its plurality of holes or channels filled with porous pad material allows the fluids provided into the core to uniformly exit the brush core through the porous pad or brush material therefore evenly supplying the desired fluid to the brush or pad surface. The base with its plurality of channels filled with the porous pad material interlocks the porous pad material to the base and prevents or reduces walking or twisting of the brush nodes.

Wafers may be scrubbed in a horizontal or a vertical orientation. The brushes are configured to rotate in a desired direction such that both sides of the wafer are evenly scrubbed, using an equal and opposite pressure on each side of the wafer. For more information on vertical wafer scrubbing, reference may be made to U.S. Pat. No. 5,875,507, entitled "Wafer Cleaning Apparatus," which is hereby incorporated reference.

The base housing of the present invention may be a cylinder, tube, or mandrel, and alternately may be a disk or shortened cylinder. The housing base preferably has an axis of rotational symmetry. FIG. 4 and FIG. 5A illustrate non-limiting alternative embodiments of a rotatable base or fixture useful in the present invention. Any base shape that can be covered with a porous pad material, interlock with the porous pad material, and make proper contact with a substrate to be cleaned or polished may be used in the present invention. As shown in FIG. 1, the base has an inner surface 190 and an outer surface 120. These surfaces are preferably cleaned to remove surface contamination such as oils and ionic contaminants prior to molding and coating the base.

A mold may be used to cast a smooth pad surface or a pad surface as shown in FIG. 10B or one with protrusions, the protrusions having a variety of shapes including but not limited to bristles and nodules as illustrated in FIG. 6. The mold may have a coating of perfluorinated material such as polytetrafluoroethylene applied to its surface to aid in release of the pad from the mold, the mold itself may be made from polytetrafluoroethylene, or the mold may be made in one or more segments. A release agent such as paraffin wax in THF may be applied to portions of the surface of the base or the base material may be chemically treated prior to molding. The porous pad material formed in the mold on the base is removed from the mold.

The inner and outer surfaces of the base may be smooth, knurled, or roughen with a hatch pattern of parallel or intersecting shallow surface channels to enhance porous pad material adhesion and interlocking with the base, and to promote fluid distribution. The surface channels may have a various shapes, such as but not limited to notched square or halve round to interlock the porous pad, and may or may not interconnect the inner and outer base surfaces. FIG. 12 illustrates a non-limiting example of surface channels useful for interlocking a porous pad material to a substrate where the channels do not interconnect the inner and outer surfaces of the rotatable base. The surface channels retain the molded porous pad material and prevent it from being pulled or stretched out of the channel and away from the base. Such surface channels may include but are not limited to linear channels of various geometries along the axis of a tube, spiral channels, or circular surface channels at different radii across a platen base. It should be understood that the actual shape or geometry of the surface channels can be varied and may be eliminated altogether. The base and surface channels may also be provided with a variety of holes, pores, through channels or slits fluidly connecting the inner surface of the base with the outer surface of the base as illustrated in FIG. 4. The base may be any chemically inert polymeric material, including copolymers, materials useful in CMP cleaning processes, or CMP material removal processes. The base preferably includes chlorinated or halogenated polymers such as but not limited to CPVC, PVC, PVDF, PFA, and ECTFE. The base material has a thickness to make it rigid and maintain its shape during rotation and pressing against a substrate. Additionally the thickness should provide support to inserted fittings. The wall thickness may be greater than about 0.05 inches and preferably ranges from about 0.05 inches to greater than about 0.75 inches, though others may also be useful. In one embodiment, the holes or through channels are formed closer together near the ends of the brush than in the center of the brush. As a result, a greater amount of liquid is provided to the ends of the brush than to the center. This is a particular advantage in wafer cleaning operations where a greater effective wafer surface area near the ends of the brush must be cleaned.

The porous pad covering the outer surface of the base fills one or more of the surface channels, pores, holes, through channels, and or slits and interlocks the porous pad material with the base housing. The porous pad is cast onto the base. This interlocking maintains the alignment of the protrusions on the porous pad surface and provides consistent contact with substrates. By interlocking the channels in base with the porous pad, the movement of the pad by walking or twisting is reduced or eliminated. The porous pad may interlock with the channels of the base by filling one or more of the channels. Preferably the channels or surface of the base have a shape to mechanically and physically prevent porous pad cast or molded into the channels from being removed by pulling or twisting of the porous pad during rotation. The porous nature of the brush or pad will absorb and evenly distribute the fluids throughout the brush or pad. The porous brush or pad can absorb and distribute fluids to substrates by flow, wicking, or capillary action throughout the brush or pad. If desirable through channels may be left unfilled by the porous pad material during the molding process by filling them with an insoluble solid or packing them with a plastic plug and then removing the plug after molding.

In a preferred embodiment, the core for a cylindrical base used in a roller or brush may have a outside diameters ranging between about 0.50 inch and about 5 inches. For disk shaped bases the diameter may range to 12 or more inches. By covering a portion of the inner surface with the porous pad or brush material, the actual volume of the core may be reduced. The layer of porous material covering the inner surface of the base may be less than about 15 mm.

Endcaps such as but not limited to 214 illustrated in FIGS. 2 and 212 also illustrated in FIG. 2 may be connected to the base to provide for connection of the rotatable base to a cleaning tool, a pressurized source of fluid, a fixture for rotating the base from a tool, or a combination of these. As with the base itself, the endcaps may be molded to the housing, may be machined into a stock piece of base material, or made separately and bonded to the base. These non-limiting examples illustrate the variety of way the base housing of the present invention may be connected or mated to an existing tool for receiving fluid and rotating to perform a material removal function. A variety of fittings for connection to a wide variety of tools may be coupled to the base. Endcaps or other fitting may be attached or mated to the core. Such fittings include but not limited to fluid fittings 1910 and 2414 and machine drive fittings 1930 and 2434 shown by the non-limiting examples in FIG. 19A and FIG. 24 respectively. The endcaps may be made separately and bonded to the base using chemical, radiant, or ultrasonic bonding techniques. These non-limiting examples illustrate the variety of way the base housing of the present invention may be connected or mated to an existing tool for receiving fluid and rotating the base coated with a porous pad material interlocked with the base to perform a material removal function. A variety of fittings for connection to a wide variety of tools may be coupled to the base.

Because the volume within the bore is rapidly filled, the bore will be pressurized rapidly and the fluid will be ready to quickly outflow through the plurality of through channels or holes filled with the porous pad material and out to the surface of the porous pad material covering the core. The plurality of holes or through channels may have a diameter ranging between about 0.005 inch to about 0.50 inch. A porous sintered tube stock of ceramic or polymeric construction with micron size holes may also be used as a base. A combination of different diameter through holes may be used and distributed across the mandrel or base. Larger diameter holes or surface area through channels can distribute fluid from the core to the porous pad surface over a wider area and result in a more even distribution of fluid throughout the entire length of the porous pad covering the brush. Varying the number of holes or slits in the base may also be used to increase the surface area for fluid flow through the base.

The interlocking of the base and the porous pad in a device of the present invention can be modified for use in coating a substrate with a fluid or for material removal from any number of substrate types, for example, semiconductor wafers, hard drive discs, flat panel displays, and the like. Additionally, the brush core or brush base can be modified in its length or diameter for substrate scrubbing and material removal applications of any size, for example, 100 mm wafers, 200 mm wafers, 300 mm wafers, larger wafers, small hard disks, etc. For 300 mm diameter or large wafers the length of the rotatable base may be greater than about 25 cm. It should also be noted that any number of fluids can be delivered through the brush or pad, for example, DI water, ammonia containing chemical mixtures, HF containing chemical mixtures, surfactant containing chemical mixtures, and many other variations.

The plurality of surface channels or through channels are formed in the base. The channels can be positioned from a center point of the base to an outer edge of the base in a symmetric or asymmetric pattern for distributing fluid to the outer surface of the porous pad material. The channels may be the same size or different sized across the base. Preferably the channels may be positioned across the base to deliver a greater volume of fluid to the outer edge of the base than to the center of the base. The fluid within the pores of the pad material may be from a source of pressurized fluid that is in fluid communication with the porous material in the channels of said base through the inner surface of said base.

Fluid delivery is accomplished by implementing brush or pad cores that have a plurality of holes that allow fluids to be fed into the brush or pad core at a particular pressure to be released into an outer brush or pad surface. During use, liquid flows from inside of the base through one or more perforations or through channels in the base filled with the porous base material. After flowing through the porous base material in the perforations, the fluid is distributed throughout the porous pad material covering the outside the base where it is used with the substrate to be treated. Besides fluid inlet pressure, the flow of liquid from the inner surface of the base to the housing can be controlled by appropriately selecting the dimensions of the longitudinal slits, holes or pores in the base through which the liquid must flow. Generally, increasing the cross-sectional area increases the flow of liquid through the particular slit or hole. Thus, the flow of liquid from the shaft to the brush or pad housing is readily controlled by selecting the cross-sectional area of the through holes of the distributor. Variation in the surface area of the perforations or through channels in the base may be made along the length or diameter of the base. This is illustrated schematically in FIG. 1A where through channels 130 and 180 are different size, and this is also illustrated schematically in FIG. 4 where through holes 484 and 480 differ in size and also differ from through channels 450. The wall thickness of the base will also determine the flow of liquid from the inner surface to the outer surface with a thicker base permitting less flow than a thicker base. Lastly, the porosity and surface energy of the porous base material contribute to the conductance of fluid. A higher porosity and a surface energy like the fluid are preferable to increase fluid flow and maintain surface wetting.

As shown in FIG. 12, the device for removing materials, particles, or contaminants from substrates includes a rotatable base for supporting a porous pad material. The base include an inner surface and an outer surface and a plurality of channels in the base for interlocking the porous pad material with the base. A porous pad material covers at least a portion of the outer surface of the base and is used for removing material from substrates. The porous pad material fills one or more of the channels in the base and interlocks the porous pad material with the base. As illustrated in FIG. 2 the channels fluidly connect the inner surface with the outer surface of the base. The through channels 250 in the base distribute fluid from the inner surface of the base to the outer surface of the base through the porous pad material and also interlock the porous base material with the base. The through channels may be notched, grooved or roughen to aid in retaining or adhering and interlocking the porous material. Preferably porous pad material also covers at least a portion of the outer surface of the base for removing material from substrates. The device in FIG. 16 for removing materials, particles, or contaminants from substrates includes a rotatable base for supporting a porous pad material. The base include an inner surface and an outer surface and a plurality of channels in the base for interlocking the porous pad material with the base. A porous pad material covers at least a portion of the outer surface of the base and is used for removing material from substrates. The porous pad material fills one or more of the channels in the base and interlocks the porous pad material with the base. As illustrated in FIG. 21B the channels 2126 fluidly connect the inner surface with the outer surface of the base. The through channels 2126 in the base distribute fluid from the inner surface of the base to the outer surface of the base through the porous pad material (not shown). The through channels may be notched, grooved or roughen to aid in retaining or adhering the porous material. Preferably porous pad material also covers at least a portion of the outer surface of the base for removing material from substrates.

The porous pad material may cover a base in the shape of a roller where at least a portion of the outer surface of a sidewall of a cylinder that is used to support the porous pad material is covered. Alternatively, the porous pad material may be a base in the shape of a pad or disk as shown in FIG. 5A and FIG. 5B where the porous pad material covers at least a portion of the outer surface of the endcap of a cylinder and the rotatable base is mounted to a single fitting which is used for both machine drive and fluid flow to the center of the base.

The porous pad material covers at least a portion of the outer surface of the base. The porous pad material may be bonded to one or more surfaces of the rotatable base to form an adherent layer by chemical, mechanical, or a combination of these bonds. After forming an adherent layer with the rotatable base housing surface, the porous pad material permits fluid flow through the porous pad material. Subsequent layers of porous pad material may be molded or cast onto the first porous pad material bonded to the base. The additional porous pad layer may be chemically, mechanically, or a utilizing a combination of both, bonded to the first porous layer while maintaining porosity to fluid flow from fluid received from flow channels in the base. Optionally the porous pad material may fill one or more of the fluid flow channels in the base.

The porous pad material covers at least a portion of the outer surface of the base and the porous pad material fills one or more of the through channels in the base. Preferably the porous pad material filling the through channels and covering the base surface are continuously formed into a monolithic structure that interlocks the porous pad material with the base. More preferably the porous pad material fills the through channels or the base and covers both the outer surface and the inner surface of the base in a continuously formed monolithic structure of the porous base material. The porous base material covering the outer surface of the base or housing may have a thickness greater than about 1 mm and is preferably from about 1 to about 20 mm.

The devices of the present invention can also include a fluid in the porous pad material which may be pressurized. Fluids may include water and aqueous chemistries such as but not limited to ammonium hydroxide or hydrofluoric acid. The source of pressurized fluid is in fluid communication with the porous material in the channels of device base through the inner surface and core of the base.

The porous pad material covering the base preferably includes surface protrusions or recesses for removing particles or materials from a substrate or for distributing fluid across a substrate. The porous pad material with protrusions fills one or more of the channels in the base and interlocks the porous pad material with the base. The channels in the base maintain the alignment, height, and or distribution of protrusions on the surface of the porous pad material. Preferably the channels fluidly connect the inner surface with the outer surface of the base. The through channels in the base distribute fluid from the inner surface of the base to the outer surface of the base through the porous pad material.

The roller and pad devices of the present invention may be made by the acts which include pouring a combination of un-polymerized sponge monomer and a catalyst for polymerizing the monomer into a mold. The mold includes a housing or base with preformed channels that are filled with the porous pad material to interlock the porous pad material with the housing. The combination of un-polymerized sponge monomer and a catalyst in the mold are cured and the housing with porous pad material filling the channels in the housing released from the mold. The final product is a brush or pad that is cast onto the base. Preferably the mold also includes an outer mold for forming a surface texture of the porous pad material covering the housing. The outer mold is used to control the shape, height, and thickness of the outer porous pad material. The protrusions may be but are not limited to square shaped or rectangular shaped cylinders. The protrusion or node height may be less than about 5 cm, and their diameter less than about 2 cm. Continuous surface protrusions may also be formed with lengths similar to the brush or pad and widths of about 2 cm or less. More preferably the mold includes an inner mold for controlling the thickness of the inner layer of the porous pad material coating the inner surface of the housing.

Preferably the porous pad material interlocked with the base includes polyvinylalcohol and the housing includes polyvinylchloride. Preferably the porous pad material of the present invention includes less than part per million levels of harmful impurities such as metallic ions like calcium and iron and chloride ions. The porous polymeric pad member is substantially free from loose portions (e.g., un-cross-linked) of the porous polymeric member greater than about 1 micron in size, or greater than about 0.5 micron in size, or greater than about 0.1 micron in size.

As shown in FIG. 3B and FIG. 5B, the devices can range in size and shape, depending upon the application. According to an embodiment, the device can be shaped as brush rollers, which have protrusions on their surface, or brush rollers that have smooth surfaces. These brush rollers have shapes and sizes to meet the particular cleaning application or material removal from devices such as semiconductor wafers, hard disks, and other substrates. The device can also be in the form disks, puck brushes, and plugs.

The cast on brushes of the present invention may be made using a suitable material that is film, porous, elastic, and has certain abrasion resistiveness. In most embodiments, the main raw starting material for the device is polyvinyl alcohol, but can be others. As merely an example, polyvinyl alcohol is used to form a polyvinyl acetal porous elastic material. The porous material varies in characteristic depending upon cleanliness, type of pore forming agent or process, type of aldehyde employed for the conversion of a polyvinyl alcohol to a polyvinyl acetal, and other factors. Preferably the PVA sponge material may be prepared from acid catalyst and an aldehyde mixed with a water solution of polyvinyl alcohol produced from polyvinyl acetate homopolymer or polyvinyl acetate containing copolymers less than 25% by weight or alloyed with water soluble polymers to no greater than 10% by weight of solids. Other factors which affect the properties of the porous material also include the relative proportions of reactants, reaction temperature and time, and the general condition and starting materials in the manufacturing process. Cleanliness of the manufacturing process is also important in the manufacture of these devices.

The outer brush or pad surface is made out of a very porous and soft material so that direct contact with the delicate surface of a substrate does not cause scratches or other damage. Preferably, the outer brush surface is made out of a material that includes polyvinyl alcohol (PVA) foam. Although, other moldable materials such as but not limited to nylon, polyurethane, or a combination of polyurethane and PVA or other copolymers that interlock with channels in the base and that do not scratch substrate surfaces and provide suitable material removal for the process may be used including U.S. Pat. No. 4,083,906 Schindler (polyethylene glycolpolyacrylamide); U.S. Pat. No. 5,311,634 Andros, Nicholas (surfactant air foam systems and core cast); U.S. Pat. No. 5,554,659 Rosenblatt, Solomon (Surfactant air foam); U.S. Pat. No. 2,609,347 Wilson, Christopher (Early surfactant foam systems); and U.S. Pat. No. 3,663,470 Nishimura et al (Early starch based sponges), the contents of which are incorporated herein by reference in their entirety.

Molding a textured brush or pad onto a core eliminates the need for removing newly cast brushes from a mandrel reducing some losses of brushes damaged during this process. Cleaning of sponges on cores to rid them of excess reagents and fugitive particles is improved during wash cycles because they agitate with greater aggression.

Cleaning effectiveness and material removal efficiency of the brushes and pads of the present invention may also depend upon a porosity and pore size of the porous pad material. Porous pad material should provide flexibility to the pad material but not have too much porosity that the pad material looses its strength. The porosity can be more than about 85%. In devices where porosity is less than 85% for polyvinyl acetal porous elastic materials, the pad may have poor flexibility. The porosity may less than about 95%, since a greater porosity value may provide poor strength. Other characteristics include a desirable average pore size or opening. The pore size opening in some embodiments ranges from about 10 micron to about 200 microns. In devices where the average pore opening is less than 10 micron, the porous elastic material may have poor elasticity and/or flow properties, thus making the performance of the cleaning roll unsatisfactory. Alternatively, the average pore opening of more than 200 microns can be unsuitable for a cleaning roll because of inconsistent pore configuration. Of course, the selected pore size and porosity depend upon the application and materials used to form the porous pad material.

The polyvinyl acetal porous elastic material usable for the present invention can be produced in a known manner, for example, by dissolving at least one polyvinyl alcohol having an average degree of polymerization of 300 MW to 3,000 MW and a degree of saponification of not less than 80% in water to form a 5% to 30% aqueous solution, adding a pore forming agent to the solution, and subjecting the solution to reaction with an aldehyde such as formaldehyde or acetaldehyde until the material becomes water-insoluble. In this case the polymer is 50 to 70 mole % of acetal units. In some embodiments, where the polymer has less than 50 mole % of acetal units, the retained polyvinyl alcohol may ooze out from the product upon use and undesirably contaminate the article to be cleaned. Where the polymer has more than 70 mole % of acetal units, the device may have poor elasticity and flexibility in other embodiments.

Although the above devices are generally described in selected shapes and sizes, alternative configurations can also be used. As merely an example, the polymeric product can have a gear-like configuration, which has numerous parallel grooves formed at an angle to the roll. Additionally, protrusions or projections on the surface of the foam product can include a variety of shapes, e.g., circular, ellipsoidal, rectangular, diamond, cylindrical pyramidal or the like. Preferably the protrusion has a square or rectangular shape profile. The spacing between adjacent protrusions may be greater than about 1 mm and preferably range from about 1 mm to about 30 mm or more.

Other techniques can also be used to manufacture porous polymeric devices used for surface treatment applications. These techniques include, among others, an air injected foam or sponge product as well as others.

Figure 12B:
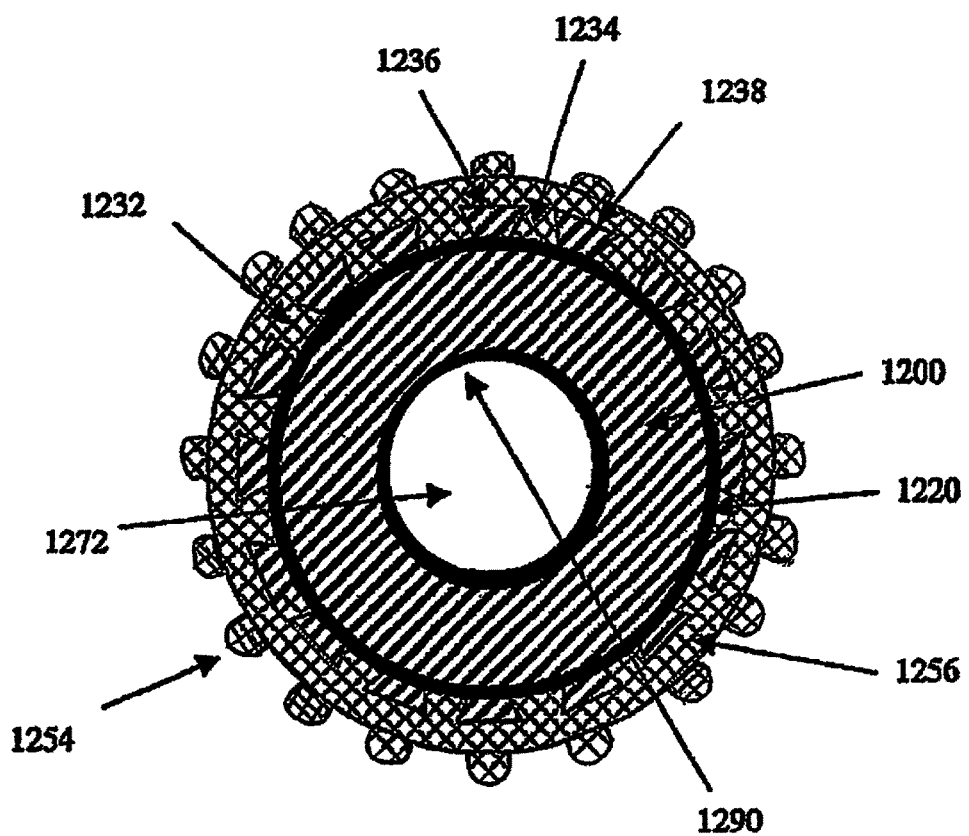
FIG. 12B illustrates a cross section of a housing base tube having channel grooves in a rotatable base surface for interlocking with the porous base material and retaining the alignment and position of nodes on the surface of a porous pad material covering the base surface.
Figure 12C:
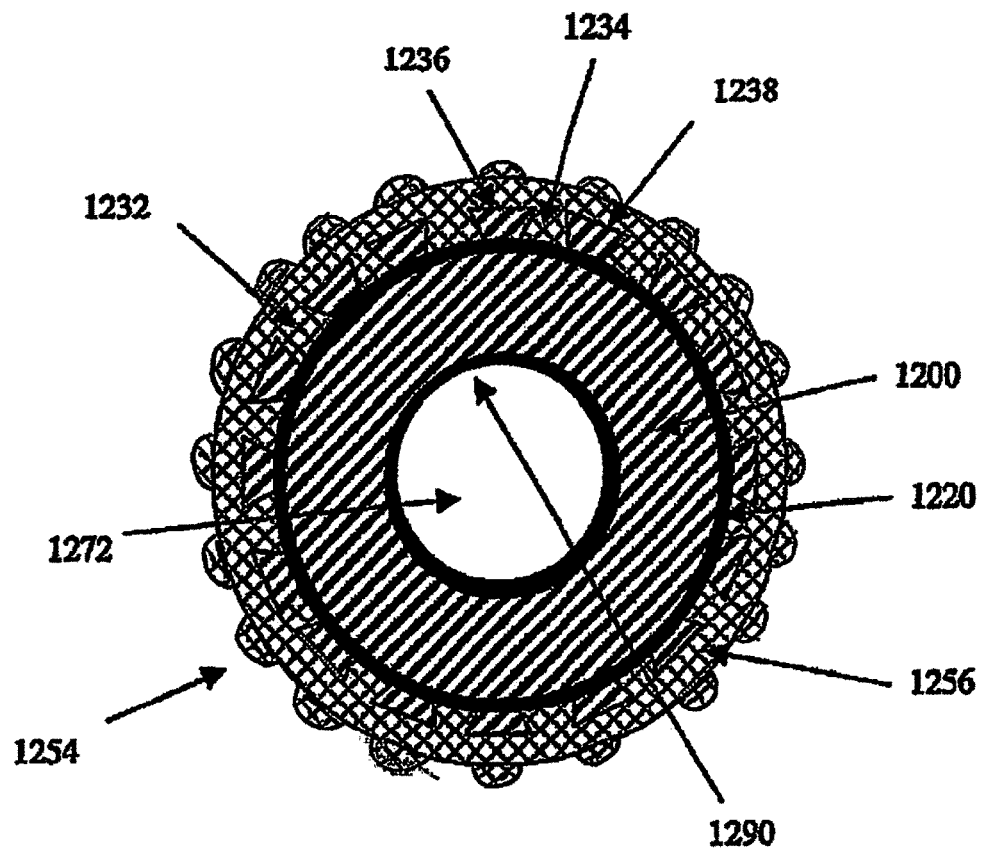
FIG. 12C illustrates a cross section of a housing base tube having channel grooves in a rotatable base surface for interlocking with the porous base material and retaining the alignment and position of nodes on the surface of a porous pad material covering the base surface.

Typically, the polishing pad includes brushes that perform the mechanical aspect of the CMP process. Brushes can be in the form of a pad or in the form of a roller. The roller can also be used to clean the wafer, and commonly includes a plurality of bristles, or protrusions around the outer cylindrical surface of the roller. Roller brushes may have rectangular protrusions set at a fixed pitch across the entire body of the roller. An example of one such roller brush in cross section is shown in FIG. 12. In applications where a square or rectangular protrusion such as shown in FIG. 12 collects or proliferates contamination (e.g., slurry build-up) around the outer edge of the protrusion, which can also cause scratches to the underlying substrate, the protrusions are preferably rounded or spherical in profile as shown in FIG. 12B and FIG. 12C, respectively.

Various aspect and advantages of the present invention may be understood by reference to the following non-limiting examples.

Example 1

A quantity of Airvol V-107 was purchased from Air Products Inc. The polyvinylalcohol was dissolved as follows: 180 g polyvinylalcohol V-107 and 600 grams of tap water. The mixture was mixed and heated to about 100. degree. C. until all the polyvinyl alcohol dissolved.

From this mixture, small test batches were made as follows: 175 grams. Polyvinylalcohol solution 30%; 48 grams formaldehyde 37%; 27 grams sulfuric acid 36%; and 13.5 grams corn starch. These ingredients were mixed in the order starch, $H_2SO_4$, formaldehyde, and last the 30% PVA solution. This new mixture was free of entrained air. The solution was of low viscosity, opaque, and at room temperature. All of this material was poured into a polyvinylchloride mold and heated to 70. degree. C. for three hours. Inspection of the sponge formed in the mold revealed excess bonding to the PVC mold surface. Some sponge material was treated with $H_2O_2$/$NaHCO_3$ and investigated.

The sponge was well developed, white, soft, and conformed well to the mold with good wicking action. PVC surfaces may be pre-treated with a mold release agent as 10% solution of paraffin wax in THF.

Example 2

Another part of this invention is a method for preparing a PVC brush mold so that the inventive cleaning brush can be removed efficiently the mold without tearing the bristles from the exterior surface of the brush. It has been found that prior to injecting a PVC brush mold with PVA, that applying a preferred mixture of tetrahydrofuran (THF) and paraffin to the PVC mold creates a coating on which PVA does not appreciably stick. Upon completion of manufacturing, using a PVC mold prepared by the method described, the brush can be easily removed from the mold by hand.

Without wishing to be bound by theory, the paraffin and THF mixture, when applied in proper proportions is believed to act upon the PVC material by forming an alloy layer comprised of some or all of the elements PVC, THF, and paraffin. This alloy layer is in the form of a visible sheen which can be physically scratched off of the mold until the pure PVC located below the alloy layer, is exposed. The alloy layer is durable and can remain on the mold through a plurality of manufacturing cycles. When the alloy layer becomes removed from the PVC mold, it can be re-coated with the paraffin and THF mixture, to regenerate the non-stick qualities of the mold.

A preferred mixture of paraffin and THF which has been found to achieve the proper nonstick coating characteristics is to add about 10 grams of paraffin to 1 liter of THF (10 g/l). This preferred mixture results in good fluid characteristics for flowing easily into the mold and readily achieves the creation of the alloy layer. However, an effective range of paraffin to THF has been found to be approximately 5 g/l to 20 g/l. Below approximately 5 g/l, the THF volatilizes too quickly for it to act effectively upon the PVC and create the allow layer, while above approximately 20 g/l the paraffin crystallizes and the mixture is not fluid enough to be useful for coating a PVC brush mold.

As a first step in manufacturing the inventive cleaning brush, a PVC mold is provided. The mold is comprised of a PVC pipe, a core and end caps for fitting on the PVC pipe. The PVC pipe can be a standard cylindrical PVC pipe with a plurality of properly sized holes, for forming bristles, drilled through the pipe walls. The density of the bristle holes are approximately 70 per square inch, to match the bristle density of the finished brush. The end caps are provided for fitting on each end of the pipe, thereby providing a means for preventing the outflow of PVA material from each end, when the mold is filled. A core is provided for fitting in a centering position within the hollow cylindrical interior of the PVC pipe, the core for creating the hollow inside diameter of the finished brush. Next, the PVA contacting surfaces of the mold are coated with the paraffin and THF mixture and the alloy layer is allowed to form. When a dry sheen appears on the PV A contacting surfaces, the alloy layer is formed and the mold is ready to be used in production. A plastic wrap is next applied around the mold to keep the PVA from flowing out of the bristle holes. Next, an end cap is placed on the lower end of the pipe and the mold is filled with the PVA mixture.

The PVA mixture is comprised of formaldehyde or paraformaldehyde, acid catalyst, PVA, and starch. The starch is a pore former, which creates the porous quality of the finished brush. Upon filling the mold with the PVA mixture the second end cap is placed on the upper end of the pipe. Next, the mold is vertically spun along its long axis at a sufficient velocity to allow the PVA mixture to flow into the bristle holes and to force air bubbles from the PVA. After spinning the upper cap is removed. The forcing of air bubbles from the PVA mixture causes the level of PVA to drop inside of the mold. The mold is next topped-off with an additional amount of PVA mixture sufficient to fill the mold to an appropriate level for fully forming the inventive brush. The mold can be spun again to get rid of any further minor quantity of air bubbles, if desired. Next the mold is placed in an oven to cure overnight, about 16-24 hours, at about 125 Fahrenheit. When finally cured, at least one endcap and the core are removed to access the finished brush. The brush can then be removed from the pipe by grasping an end of the brush by hand and working it free from the pipe.

Example 3

This prophetic example describes cleaning a wafer having a layer of copper metal following a chemical mechanical planarization process. The wafer may be introduced into a first brush box of the cleaning system. In the first brush box cleaning chemical can be applied to the wafer through the brushes which are formed of a cast on core porous pad material interlocking to the base core of the brush. The cleaning chemical applied through the brushes in the first brush box controllably transforms copper material on the substrate surface into a water soluble form. The copper material is transformed into a water soluble form in order to remove a controlled amount of copper from the surface of the wafer. The wafer can be moved from the first brush box to the second brush box. In the second brush box a second cleaning chemical may be applied to the surface of the wafer through the brushes of the second brush box in order to clean the wafer surface and clean the brushes of copper. The second cleaning chemical may contain the same chemical composition as the cleaning chemical in the first brush box. The purpose of the second cleaning chemical applied through the brushes is to clean the brushes of copper and other materials that may have been cleaned from the wafer surface. The second cleaning chemical may be applied through the brushes for between about 3 seconds and about 10 seconds. Next the wafer can be rinsed with deionized (DI) water by flowing water through the brushes of the second brush box to remove the second cleaning chemical from the wafer surface and the brushes. The wafer surface is rinsed preferably for between about 20 seconds and about 40 seconds. After the operations in the second brush box, the wafer may be transferred to a spin, rinse, and dry (SRD) station after which the wafer may then be stored in an output station for subsequent processing.

Example 4

In this prophetic example, the brush with cast on a core porous pad material interlocking with the brush substrate is used with an etchant to remove a controlled layer of an oxide surface and to maintain a hydrophilic surface.

The CMP process can be performed in a scrubber that scrubs both sides of a workpiece simultaneously. In the cleaning process hydrofluoric acid (BF) solution can be delivered to the core of a brush having a porous PVA pad layer that interlocks with the brush core. After delivering the hydrofluoric acid (HF) solution to the brush core, the HF solution can be applied to the workpiece through the channels filled with the porous pad material of the brush. This can be followed by chemical mechanical scrubbing of the workpiece with the brush. The solution may be applied concurrently with the brush scrubbing of the workpiece.

The concentration of the BF solution can be in the range of approximately 0.005%-1.0% BF, depending upon the amount of oxide to be removed. The solution preferably includes a mixture of approximately 0.005 percent HF in water. The HF solution can be applied to the wafer for a predetermined amount of time, for example, 20-40, or 25-35 or about 35 seconds.

Example 5

In this prophetic example, a brush with porous pad material interlocking with the brush substrate is used in a cleaning step in the manufacturing process an integrated circuit such as a microprocessor or a dynamic random access memory device.

Methods for making an electronic device such a microprocessor or a dynamic random access memory device are well known to those skilled in the art. These devices include metal interconnect and dielectric layers which are applied to active devices on the wafer surface to form electrical contact with external electronic circuitry and devices. These dielectric and metal layers are formed using standard lithography, material deposition, and chemical mechanical planarization techniques. After chemical mechanical planarization, the wafer is cleaned to remove residual slurry and chemicals by contacting the wafer including electronic devices and interconnects with a molded on core PVA brush. This brush has a plurality of channels in the brush base for interlocking the porous PVA brush pad material with the brush base and for distributing cleaning fluid to the surface of the wafer with the electronic devices. Once the wafer has been cleaned it can undergo further processing steps to complete its fabrication including sealing and dicing the wafer to package the individual integrated circuit devices.

Example 6

This prophetic example illustrates how a cast on core brush may be made and bonded to fluid and machine drive fittings. As a first step in manufacturing the inventive cleaning brush, a PVC mold is provided. The mold is comprised of a PVC pipe, a core and end caps for fitting on the PVC pipe. The PVC pipe can be a standard cylindrical PVC pipe with a plurality of properly sized holes, for forming bristles, drilled through the pipe walls. The density of the bristle holes are approximately 70 per square inch, to match the bristle density of the finished brush. The end caps are provided for fitting on each end of the pipe, thereby providing a means for preventing the outflow of PVA material from each end, when the mold is filled. A core is provided for fitting in a centering position within the hollow cylindrical interior of the PVC pipe, the core for creating the hollow inside diameter of the finished brush. A plastic wrap is next applied around the mold to keep the PVA from flowing out of the bristle holes. Next, an end cap is placed on the lower end of the pipe and the mold is filled with the PVA mixture.

The PVA mixture is comprised of formaldehyde or paraformaldehyde, acid catalyst, PVA, and starch. The starch is a pore former, which creates the porous quality of the finished brush. Upon filling the mold with the PVA mixture the second end cap is placed on the upper end of the pipe. Next, the mold is vertically spun along its long axis at a sufficient velocity to allow the PVA mixture to flow into the bristle holes and to force air bubbles from the PVA. After spinning the upper cap is removed. The forcing of air bubbles from the PVA mixture causes the level of PVA to drop inside of the mold. The mold is next topped-off with an additional amount of PVA mixture sufficient to fill the mold to an appropriate level for fully forming the inventive brush. The mold can be spun again to get rid of any further minor quantity of air bubbles, if desired. Next the mold is placed in an oven to cure overnight, about 16-24 hours, at about 125 Fahrenheit. When finally cured, at least one endcap and the core are removed to access the finished brush. The brush can then be removed from the pipe by grasping an end of the brush by hand and working it free from the pipe. A fluid fitting as shown in FIG. 4 and a machine drive fitting as shown in FIG. 4 made from PVC stock material may be solvent bonded to the PVC core.

Although the present invention has been described with reference to various embodiments, persons skilled in the art will recognize that changes may be made in form and detail without departing from the spirit and scope of the invention. For example, the wafer can be a generally circular silicon wafer, glass wafer, ceramic wafer, oxide wafer, tungsten wafer although other types of wafers can be used. Further, although various values, materials and dimensions have been provided, it is understood that these values, materials and dimensions are only illustrative and not limiting and that other values, materials and dimension can be used. For example, instead of slots having rectangular cross-sections, slots having other cross-sectional shapes such as semicircular slot can be used. Further, although various liquids have been set forth, it is understood that substantially any liquid or chemical can be used with a wafer cleaner and brush assembly in accordance with the present invention. For example, various alcohols, surfactants, ammonia based solutions, buffer solutions, high pH solutions and low pH solutions can be used. Thus, the invention is limited only by the following claims.

What is claimed is:

1. A method of making a monolithic porous pad on a base comprising:
    pouring a combination of un-polymerized sponge monomer and a catalyst into a mold including a base having a plurality of channels circumferentially arranged around an axis of the base, the plurality of channels being filled with first porous sponge material, said combination of un-polymerized sponge monomer and a catalyst filling one or more channels of the plurality of channels in said base;
    curing said combination to form a second porous sponge material interlocked with said base; and
    releasing said second porous sponge material interlocked with said base from said mold.

2. The method of claim 1 wherein a surface of said mold is treated with a release compound.

3. The method of claim 1 wherein the sponge material includes polyvinylalcohol.

4. The method of claim 1 wherein the base is a rotatable base.

5. The method of claim 1 wherein the base is a rotatable base and includes a first porous adherent layer on said base.

6. The method of claim 4, the rotatable base being a hollow rotatable base, wherein the plurality of channels permit fluid flow between an inner surface and an outer surface of said hollow rotatable base, the second porous sponge material covering a portion of the inner surface of the hollow rotatable base reduces a volume of the hollow rotatable base, and wherein the second porous sponge material covers at least a portion of the outer surface of the hollow rotatable base and fills one or more of the channels.

7. The method of claim 6, including combining the hollow rotatable base with a fitting for mounting the base to a rotating shaft.

8. The method of claim 6, wherein the second porous sponge material is formed in the mold to include one or more nodules.

9. The method of claim 6, wherein the first porous sponge material defines an adhering porous pad layer and wherein the second porous sponge material interlocks with the hollow rotatable base through the adhering porous pad layer.

10. The method of claim 6, further including combining the hollow rotatable base with an endcap, wherein the end cap and the inner surface define a volume of the hollow rotatable base for holding a fluid which communicates through the channels to fluidly connect the inner surface and the outer surface.

11. The method of claim 8, the second porous sponge material on the hollow rotatable base forming a cylindrical roller, wherein the nodules circumferentially and outwardly extend from the second porous sponge material, each nodule defining a height extending from an outer circumferential surface of the second porous sponge material to a substrate engagement surface of the nodule, the substrate engagement surface of one or more of the nodules having a rounded or spherical surface, wherein, when fluid is injected in the hollow rotatable base, the fluid travels outwardly through the second porous sponge material and fills one or more of the through channels, thereby interlocking the second porous sponge material and hollow rotatable base such that the height and alignment of the nodules with respect to the hollow rotatable base is maintained as the cylindrical roller is engaged with a substrate.

12. The method of claim 11, wherein the cylindrical roller can be positioned on the substrate such that the nodules are positioned to have only the rounded or spherical substrate engagement surface contact the substrate such that no linear surface of the one or more nodules contacts the substrate.

13. The method of claim 1, wherein the monolithic porous pad formed on the base comprises a generally cylindrical body having a circumferential outer surface, the second porous sponge material including a plurality of unitarily formed nodules projecting outwardly from and circumferentially around the outer surface of the cylindrical body, wherein the nodules are spaced apart from each other and separated by gaps, each nodule having a height extending from the outer surface of the cylindrical body to a substrate engagement surface of the nodule, and wherein the substrate engagement surface of one or more of the nodules has a rounded configuration, the base being a hollow rotatable base, wherein the one or more channels permit fluid flow between an inner surface and an outer surface of the hollow rotatable base, the second porous sponge material including the outer surface of the generally cylindrical body and the plurality of nodules that cover at least a portion of the outer surface of the hollow rotatable base and fills one or more of the channels of the hollow rotatable base to form the generally cylindrical body, thereby interlocking the second porous sponge material and hollow rotatable base such that the height and alignment of the nodules with respect to the hollow rotatable base is maintained when a brush is in use.

14. The method of claim 13, wherein each nodule includes a nodule body extending between the outer surface of the cylindrical body and the substrate engagement surface, the nodule body extending generally radially from the outer surface such that the nodule body forms a right angle where it intersects the outer surface.

15. The method of claim 13, wherein the second porous sponge material also covers at least a portion of the inner surface of the hollow rotatable base and reduces a volume of the hollow rotatable base.

16. The method of claim 13, wherein the first sponge material defines an adhering porous pad layer and wherein the second porous sponge material interlocks with the hollow rotatable base through the adhering porous pad layer.

* * * * *